United States Patent
Dekel et al.

(10) Patent No.: US 12,289,119 B2
(45) Date of Patent: Apr. 29, 2025

(54) LOW-POWER SYSTEMATIC ECC ENCODER WITH BALANCING BITS

(71) Applicant: SAMSUNG ELECTRONICS CO., LTD., Suwon-si (KR)

(72) Inventors: Idan Dekel, Suwon-si (KR); Amit Berman, Suwon-si (KR); Ariel Doubchak, Suwon-si (KR); Yaron Shany, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 51 days.

(21) Appl. No.: 18/142,703

(22) Filed: May 3, 2023

(65) Prior Publication Data

US 2024/0372568 A1 Nov. 7, 2024

(51) Int. Cl.
*H03M 13/39* (2006.01)
*H03M 13/15* (2006.01)
*H03M 13/19* (2006.01)

(52) U.S. Cl.
CPC ..... *H03M 13/3961* (2013.01); *H03M 13/152* (2013.01); *H03M 13/19* (2013.01)

(58) Field of Classification Search
None
See application file for complete search history.

(56) References Cited

U.S. PATENT DOCUMENTS

2010/0231425 A1 9/2010 Chaichanavong

FOREIGN PATENT DOCUMENTS

DE 10 2022 101183 A1 4/2023

OTHER PUBLICATIONS

Communication dated Mar. 12, 2024 issued by the European Patent Office in European Application No. 23193864.8.
Ruslan Morozov et al., "Successive and Two-Stage Systematic Encoding of Polar Subcodes", IEEE Wireless Communications Letters, Feb. 2019, vol. 8, No. 3, pp. 877-880 (4 pages total).

*Primary Examiner* — Guerrier Merant
(74) *Attorney, Agent, or Firm* — Sughrue Mion, PLLC

(57) ABSTRACT

Systems, devices, and methods for encoding information bits for storage, including obtaining information bits and a target constraints vector, placing the information bits in an input vector, setting balance bits included in the input vector to zero, encoding the input vector using a systematic code to obtain a preliminary codeword, applying a constraints matrix to the preliminary codeword to obtain a preliminary constraints vector, applying a transition matrix to a sum of the preliminary constraints vector and the target constraints vector to determine updated balance bits, obtaining an output codeword based on the information bits and the updated balance bits, and storing the output codeword in the storage device.

20 Claims, 29 Drawing Sheets

1400B

LOW-POWER SYSTEMATIC ECC ENCODER WITH BALANCING BITS

BACKGROUND

1. Field

Apparatuses and methods consistent with embodiments relate to managing a storage device, more particularly error correction coding using a low-power systematic error correction code (ECC) encoder using balancing bits.

2. Description of Related Art

An encoder which encodes input bits to a codeword may be referred to as "systematic" if the input bits are embedded into the codeword in a known set of indexes. However, more complicated codes are sometimes required. For example, some codes may require an additional affine constraint which a simple systematic encoder cannot enforce.

For example, a code $C_0(n,k)$ may have available a simple, systematic encoder which receives k information bits and produces codewords $c \in C_0$ of length n. Some tasks may require additional set of L affine constraints in the form of Equation 1 below:

$$P_{L \times n} \cdot c_{n \times 1} = d_{L \times 1}. \qquad \text{Equation 1}$$

In Equation 1, P represents a constraints matrix, d represents a constraints vector. The simple encoder for $C_0$ may not be built to enforce these new constraints.

Therefore, there is a need for a method which may generate codewords in the set $C_0$ that uphold the affine constraints, using the simple encoder.

SUMMARY

According to an aspect of one or more embodiments, a storage system includes a storage device configured to store a plurality of codewords; and at least one processor configured to: obtain information bits and a target constraints vector, place the information bits in an input vector, set balance bits included in the input vector to zero, encode the input vector using a systematic code to obtain a preliminary codeword, apply a constraints matrix to the preliminary codeword to obtain a preliminary constraints vector, apply a transition matrix to a sum of the preliminary constraints vector and the target constraints vector to determine updated balance bits, obtain an output codeword based on the information bits and the updated balance bits, and store the output codeword in the storage device.

According to an aspect of one or more embodiments, a device for encoding information bits for storage in a storage device includes a memory interface configured to communicate with the storage device; and at least one processor configured to: obtain the information bits and a target constraints vector, obtain a preliminary constraints vector by applying a constraints transform to the information bits, apply a transition matrix to a sum of the preliminary constraints vector and the target constraints vector to obtain balance bits, obtain an output codeword based on the information bits and the balance bits, and control the memory interface to transmit the output codeword to the storage device.

According to an aspect of one or more embodiments, a method of controlling a storage system is executed by at least one processor and includes obtaining information bits and a target constraints vector; placing the information bits in an input vector; setting balance bits included in the input vector to zero; encoding the input vector using a systematic code to obtain a preliminary codeword; applying a constraints matrix to the preliminary codeword to obtain a preliminary constraints vector; applying a transition matrix to a sum of the preliminary constraints vector and the target constraints vector to determine updated balance bits; obtaining an output codeword based on the information bits and the updated balance bits; and storing the output codeword in a storage device.

According to an aspect of one or more embodiments, a method of encoding information bits for storage in a storage device includes obtaining the information bits and a target constraints vector; obtaining a preliminary constraints vector by applying a constraints transform to the information bits; applying a transition matrix to a sum of the preliminary constraints vector and the target constraints vector to obtain balance bits; obtaining an output codeword based on the information bits and the balance bits; and transmitting the output codeword to the storage device.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Embodiments of the present disclosure may relate to a general method for systematic encoding with constraints. Embodiments may enforce the desired constraints by adding parity bits, activating a simple systematic encoder twice, and then using a predetermined matrix which is constraint-specific. Accordingly, embodiments may encode the codeword and enforce the constraints with relatively low complexity proportional to their number.

As discussed above, a code $C_0(n,k)$ may have available a simple, systematic encoder which receives k information bits and produces codewords $c \in C_0$ of length n. Some tasks may require additional set of L affine constraints, which may be represented using a constraints matrix $P_{L \times n}$ and a constraints vector $d_L$. The simple encoder for $C_0$ may not be built to enforce these new constraints. Therefore, there is a need for a method which may encode words in $C_0$ that uphold the affine constraints, using the simple encoder.

This problem may be interpreted as the encoding of $C_1$, a subcode of $C_0$. This may mean that all words in $C_1$ are included in $C_0$, but because not all words in $C_0$ satisfy the additional requirements, not all words in $C_0$ are included in $C_1$. Therefore, according to embodiments, an encoder may be generalized to uphold more complicated demands.

Embodiments may relate to a general scheme which handles the scenario presented for any code $C_0$ and subcode $C_1$. For example, a set of L bits, which may be referred to as balance bits, may be added to the encoder's input in order to control the product vector $d = P \cdot c$, which may be the condition for the codeword c to be in $C_1$. According to embodiments, these balance bits may be dedicated to handle the additional affine constraints. A system may be designed that translates the balance bits to d, and vice versa. The encoder of $C_1$ may use this system to compute these balance bits with respect to the information input and the required constraints vector d. Accordingly, embodiments may be useful many storage technologies, for example Universal Flash Storage (UFS) storage devices. In addition, embodiments may be useful in many other technologies, for example data transmission and reception, data compression and decompression, data processing such as file conversion, and any other technology in which information is encoded and decoded.

Figure 1:
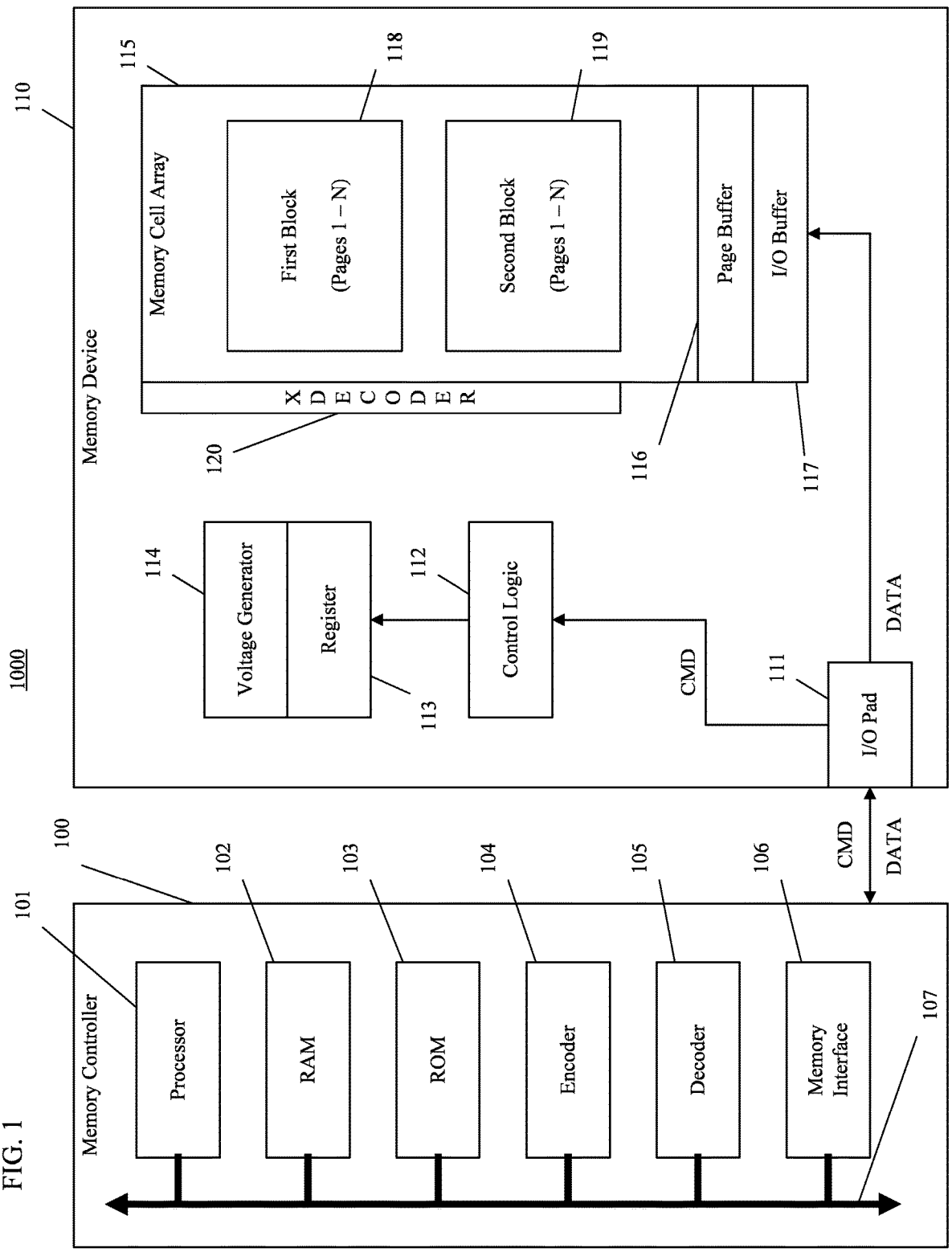
FIG. 1 is a block diagram of a memory system, according to embodiments.

FIG. 1 is a block diagram of a memory system, according to embodiments. Referring to FIG. 1, the memory system 1000 may include the memory controller 100 and a memory device 110, which may be a nonvolatile memory device.

The memory device 110 may be, but is not limited to, a flash memory device, a NAND flash memory device, a phase change RAM (PRAM), a ferroelectric RAM (FRAM), a magnetic RAM (MRAM), etc. According to embodiments, the memory device 110 may include a plurality of NAND flash memory devices. The memory device 110 may have a planar structure or a three-dimensional (3D) memory cell structure with a stack of memory cells.

The memory device 110 may include a memory cell array 115, an X Decoder 120, a voltage generator 114, a register 113, an input/output (I/O) buffer 117, a page buffer 116, and a control logic 112 each of which may be implemented as one or more circuits. The memory device 110 may also include an I/O pad 111.

The memory cell array 115 may include a plurality of word lines and a plurality of bit lines. Each memory cell of the memory cell array 115 may be implemented as a nonvolatile memory cell. For example, each memory cell of the memory cell array 115 may have, for example, a floating gate or a charge storage layer such as a charge trapping layer.

The memory cell array 115 may include a plurality of blocks and a plurality of pages. Each block may include a plurality of pages. For example, a first block 118 may include a first plurality of pages 1-N while a second block 119 may include a second plurality of pages 1-N, where N is an integer greater than 1. A page may be a unit of program and read operations, and a block may be a unit of erase operation.

The control logic 112 may control the overall operation of the memory device 110. When receiving a command CMD from the memory controller 100, the control logic 112 may interpret the command CMD and control the memory device 110 to perform an operation (e.g., a program operation, a read operation, a read retry operation, or an erase operation) according to the interpreted command CMD.

The X Decoder 120 may be controlled by the control logic 112 and drive at least one of the word lines in the memory cell array 115 according to a row address.

The voltage generator 114 may be controlled by the control logic 112 to generate one or more voltages required for a program operation, a read operation or an erase operation and provide the generated voltages to one or more rows selected by the X Decoder 120.

The page buffer 116 may be controlled by the control logic 112 and operate as a sense amplifier or a write driver according to an operation mode (e.g., a read operation or a program operation).

The I/O pad 111 and the I/O buffer 117 may serve as I/O paths of data (illustrated as "DATA") exchanged between an external device, e.g., the memory controller 100 or a host and the memory device 110.

The memory controller 100 may include a processor 101, a read-only memory (ROM) 103, a random access memory (RAM) 102, an encoder 104, a decoder 105, a memory interface 106, and a bus 107. The elements 101 through 106 of the memory controller 100 may be electrically connected to each other through the bus 107.

The processor 101 may control the overall operation of the memory system including the memory controller 100. The processor 101 may include a circuit that controls other elements by generating control signals. When power is supplied to the memory system, the processor 101 may drive firmware (e.g., stored in the ROM 103) for operating the memory system on the RAM 102, thereby controlling the overall operation of the memory system. According to embodiments, the processor 101 may also issue instructions for controlling operations of other elements of the memory controller 100 including, for example, some or all of the ROM 103, RAM 102, encoder 104, decoder 105, memory interface 106, and a bus 107. According to embodiments, any operations described herein as being performed by the memory controller 100 may be performed by, or under the control of, the processor 101. According to embodiments, any operations described herein as being performed by the memory controller 100 may be performed by, or under the control of, the processor 101 executing instructions that correspond to the operations and are included in program code (e.g., stored in the ROM 103).

A driving firmware code of the memory system may be stored in the ROM 103, however embodiments are not limited thereto. The firmware code can also be stored in a portion of the memory device 110. Therefore, the control or intervention of the processor 101 may encompass not only the direct control of the processor 101 but also the intervention of firmware which is software driven by the processor 101.

The RAM 102, which may include a memory serving as a buffer, may store an initial command, data, and various variables input from a host or the processor 101, or data output from the memory device 110. The RAM 102 may store data and various parameters and variables input to and output from the memory device 110.

The memory interface 106 may serve as an interface between the memory controller 100 and the memory device 110. The memory interface 106 is connected to the I/O pad 111 of the memory device 110 and may exchange data with the I/O pad 111. In addition, the memory interface 106 may create a command suitable for the memory device 110 and provide the created command to the I/O pad 111 of the memory device 110. The memory interface 106 provides a command to be executed by the memory device 110 and an address ADD of the memory device 110.

According to embodiments, the decoder 105 may be an error correcting code (ECC) decoder configured to decode data in the manner described above, and the encoder 104 may be an ECC encoder configured to encode data in the manner described above. According to embodiments, the decoder 105 and the encoder 104 may perform error bit correction in the manner described above. The encoder 104 may generate data added with one or more parity and/or redundancy bits by performing error correction encoding on data before the data is provided to the memory device 110. The one or more parity and/or redundancy bits may be stored in the memory device 110.

The decoder 105 may perform error correction decoding on output data, determine whether the error correction decoding is successful based on the result of the error correction decoding, and output an instruction signal based on the determination result. Read data may be transmitted to the decoder 105, and the decoder 105 may correct error bits of the data using the one or more parity and/or redundancy bits.

Figure 2A:
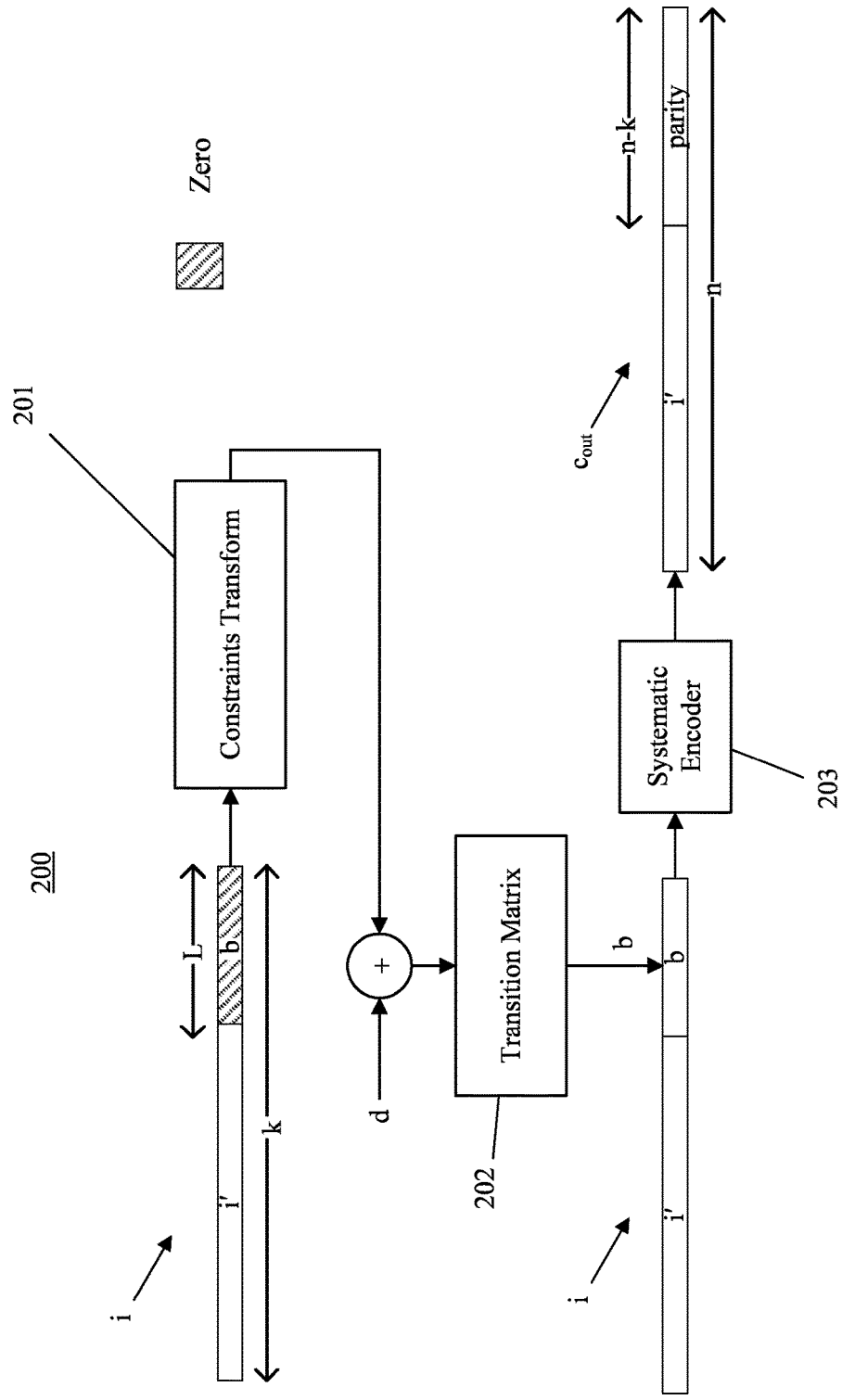
FIG. 2A is a block diagram of an encoder, according to embodiments.

FIG. 2A is a block diagram of an encoder 200, according to embodiments. In embodiments, the encoder 200 may correspond to the encoder 104 discussed above. As shown in FIG. 2A, encoder 200 may include a systematic encoder 203. The systematic encoder 203 may be a simple and systematic encoder, which may receive an input vector i and output a codeword c which is in the set $C_0$. Encoder 200 may further include a constraints transform module 201, which may be used to find a translation between the input of the systematic encoder 203 and a product vector d. Encoder 200 may further include a transition matrix module 202 that may apply a transition matrix which transforms the product vector d to balance bits b.

Figure 2B:
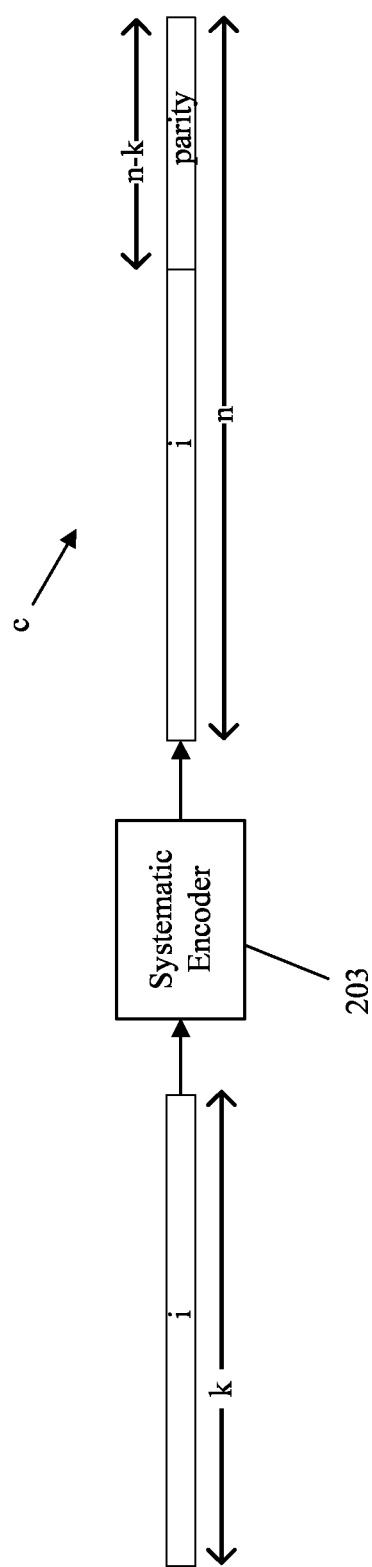
FIG. 2B is a block diagram of a systematic encoder, according to embodiments.

FIG. 2B illustrates an example of the systematic encoder 203, according to embodiments. As shown in FIG. 2B, the systematic encoder 203 may receive the input vector i, which may have length k, as an input, and may encode the input vector i in order to output the codeword c in $C_0$, according to Equation 2 below:

$$c = SimpleEnc(i) \qquad \text{Equation 2}$$

In embodiments, the systematic encoder 203 may be referred to as systematic because the input vector i may be embedded in codeword c at a known set of indexes InfoSet, such that c[InfoSet]=i.

As shown in FIG. 2B, the output codeword c may include a parity vector parity, which may be generated by the systematic encoder 203 based on the input vector i. Although FIG. 2B illustrates bits of the input vector i arranged together at a left side of the codeword c, and illustrates bits of the parity vector parity arranged together at a right side of the codeword c, embodiments are not limited thereto. For example, in embodiments each of the bits may be placed at any position throughout the codeword c.

Figure 2C:
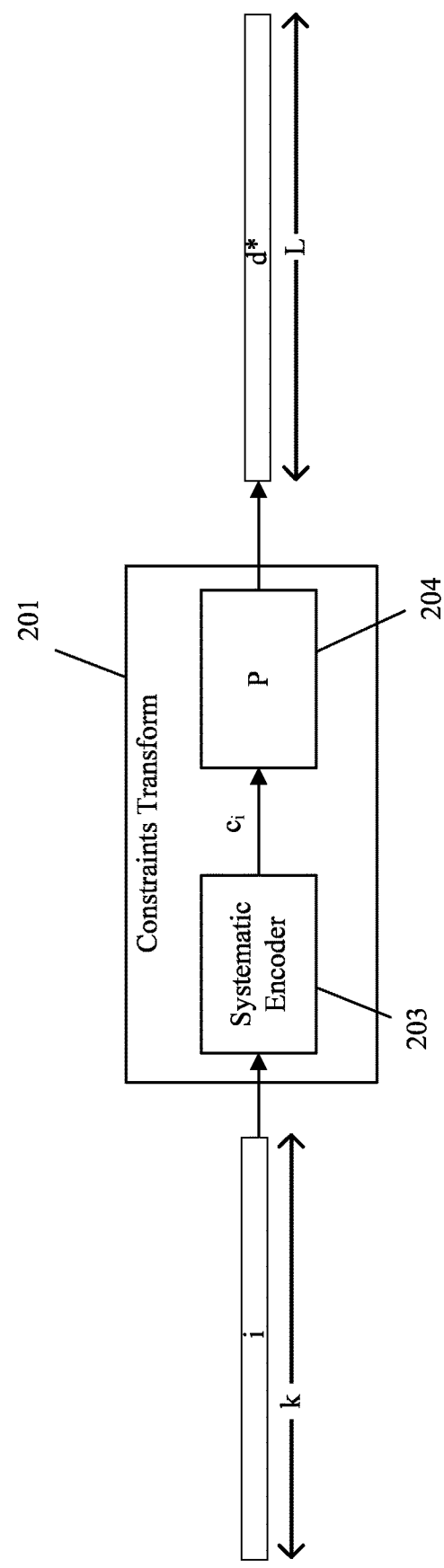
FIG. 2C is a block diagram of an example of a constraints transform module, according to embodiments.

FIG. 2C illustrates an example of the constraints transform module 201, according to embodiments. As shown in FIG. 2C, the constraints transform module 201 may receive the input vector i as an input, and may apply a linear constraints transform in order to output a preliminary constraints vector d*, which may have length L. In embodiments, the constraints transform module 201 may include a systematic encoder 203, which may encode the input vector i to obtain a preliminary codeword $c_i$ in $C_0$. Then, the constraints transform module 201 may multiply the preliminary codeword $c_i$ by a constraints matrix P to obtain the preliminary constraints vector d* according to Equation 3 below:

$$d^*_{L \times 1} = ConstraintsTransform(i_k) = \qquad \text{Equation 3}$$
$$P_{L \times n} \cdot c_{n \times 1} = P_{L \times n} \cdot SimpleEnc(i)_n$$

In order to enforce the constraints, for example in order to ensure that the codeword c is included in $C_1$, the input vector i may be expanded to include an additional L number of bits, which may be the balance bits denoted b. For example, the input vector i used as input for the encoder 200 may have a length k, and may include information bits in an information vector i', which may have a length k–L, and may further include the balance bits b, which may have a length L. In embodiments, the indexes set for the information bits in i may be referred to as set α, such that i[α]=i', and the indexes set for the balance bits in i may be referred to as set β, such that i[β]=b, and |α∩β|=0. Set β locations in the indexes of i may be tailored to the specific problem, for example to the specific codes being used, and are not necessarily consecutive.

In embodiments, the balance bits may be used to make the output codeword $c_{out}$ meet the demanded constraints, for example to ensure that the output codeword $c_{out}$ is included in $C_1$. In order to determine the relationship between the balance bits b and the preliminary constraints vector d*, a transition matrix T may be assembled. In embodiments, the standard basis may be expressed as $\{e_0, e_1, \ldots, e_{L-1}\}$, in which the kth component of a basis vector $e_k$ is equal to 1, and all other components of the basis vector ex are equal to 0 (e.g., $e_{k,k}=1$ and $e_{k,j\neq k}=0$). The transition matrix T may be used to transform the standard basis to a basis that can be used in the encoder 200.

Figure 3:
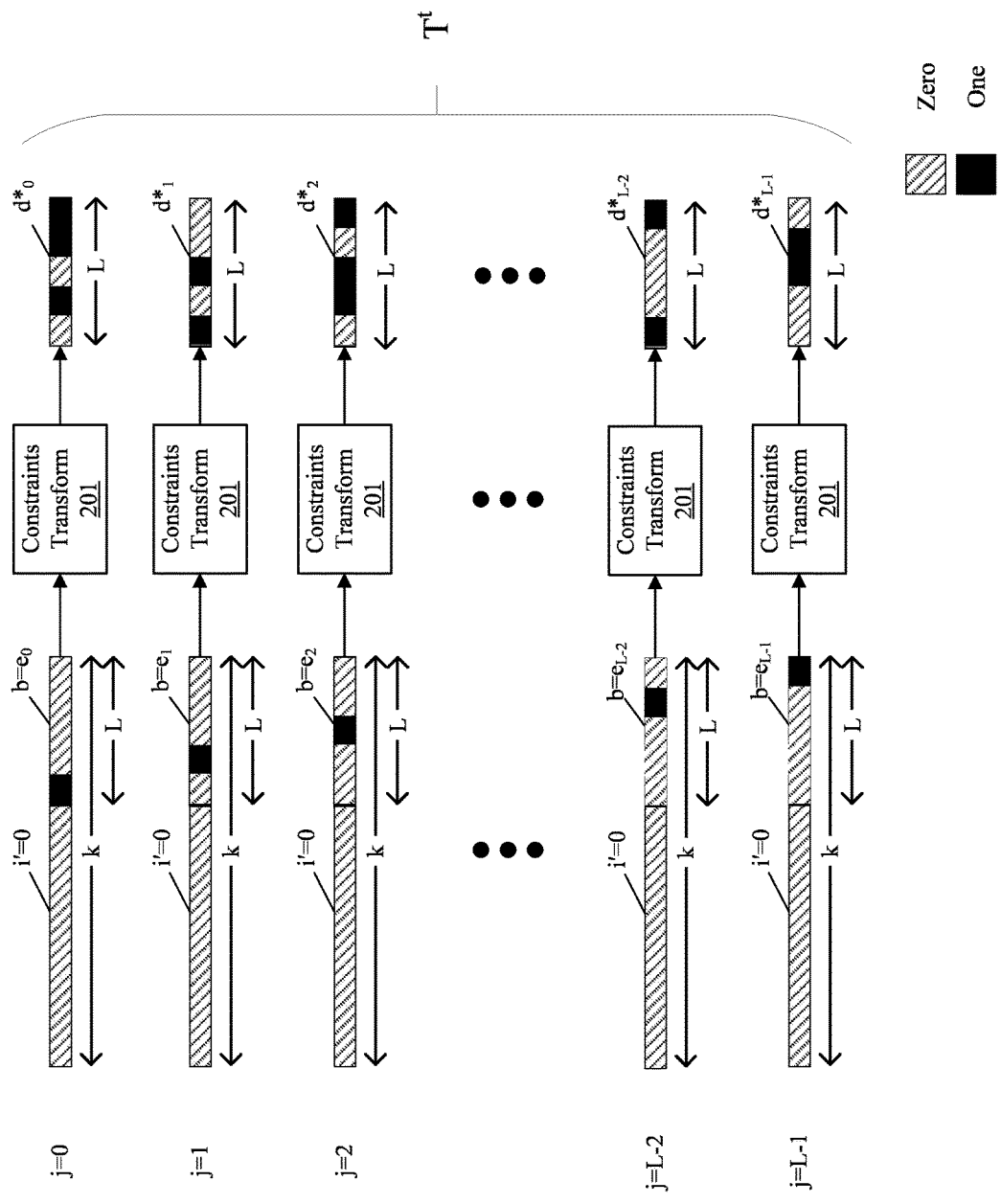
FIG. 3 illustrates an example of a process for constructing a transition matrix, according to embodiments.
Figure 4:
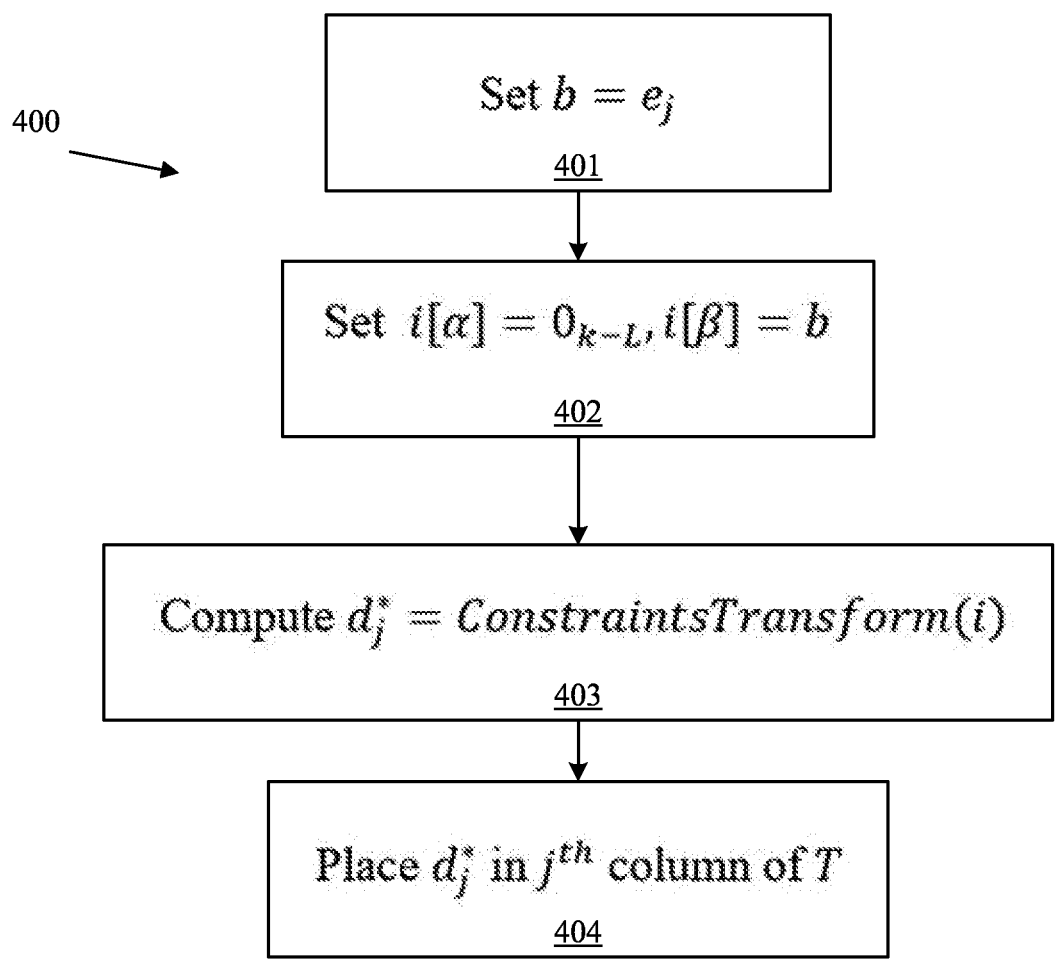
FIG. 4 is a flowchart of a process for constructing a transition matrix corresponding to FIG. 3, according to embodiments.

FIG. 3 illustrates an example of a process for constructing a transition matrix T, according to embodiments. FIG. 4 is a flowchart of a process 400 for constructing a transition matrix T corresponding to FIG. 3, according to embodiments. As shown in FIG. 3, for each j from j=0 through j=L−1, a different input vector i is input into the constraints transform module 201 to obtain a constraints vector $d_j^*$, and then the constraints vectors $d_j^*$ are assembled into the a transition matrix T.

For example, at operation 401, the process 400 may include setting the balance bits b equal to the basis vector $e_j$. At operation 402, the process 400 may include placing the balance bits b in the input vector i, and setting the information vector i' of the input vector i to 0. At operation 403, the process 400 may include computing the constraints vector $d_j^*$ using the constraints transform module 201. Then, at operation 404, the process 400 may include placing the constraints vector in the $j^{th}$ column of transition matrix T, which may be the $j^{th}$ row of an transposed transition matrix $T^t$. As illustrated in FIG. 3, the balance bits b may be grouped and aligned on a right side of the input vector i, but embodiments are not limited thereto. For example, in embodiments the balance bits b may be interleaved anywhere in the input vector i.

In embodiments, the transition matrix T may be used to manufacture any L length vector with the balance bits b. For this to happen, the transition matrix T must be fully ranked. If the transition matrix T is not fully ranked, the set β may be changed. A b to d* transform is linear, and may be represented according to Equation 4 below:

$$d^* = Tb \qquad \text{Equation 4}$$

The transition matrix T computed according to FIGS. 3 and 4 may be invertible. As a result, for any constraints vector $\vec{d}$, the balance bits $\vec{b}$ which produce the constraints vector $\vec{d}$ can be found according to Equation 5 below:

$$\vec{b} = T^{-1}\vec{d} \qquad \text{Equation 5}$$

In embodiments, the encoder 200 may receive as inputs the information vector i' and a target constraints vector $d_w$. Predetermined parameters for the encoder 200 may be determined in advance. For example, in embodiments the predetermined parameters may include, for example, a constraints matrix P such that $d_w = P \cdot c_{out}$ for every output codeword $c_{out}$ included in the set $C_1$. In addition, the predetermined parameters may include the inverse transition matrix, $T^{-1}$ and the indexes sets α, β.

In embodiments, the encoder 200 may compute the preliminary constraints vector $d_i$, which may represent the impact of the information vector i' on the constraints vector d. In embodiments, the preliminary constraints vector $d_i$ may be output by the constraints transform module 201, where $i[\alpha]=i'$ and $i[\beta]=0$. As discussed above, the constraints transform module 201 may obtain the preliminary constraints vector $d_i$ by applying the constraints matrix P to the preliminary codeword $c_i$, which may be output by the systematic encoder 203. However, the preliminary codeword $c_i$ is not known to be included in $C_1$. Therefore, the target constraints vector $d_w$ may be used to produce balance bits b which may be added to the input vector i to cause the systematic encoder 203 to produce an output codeword $c_{out}$ which is included in $C_1$. In embodiments, the balance bits b may be determined by the transition matrix module 202 according to Equation 6 below:

$$b = T^{-1}(d_i + d_w) \qquad \text{(Equation 6)}$$

Then, the systematic encoder 203 may be activated for the second time with the computed balance bits b added to the input vector i such that $i[\beta]=b$.

Because the operations performed by the encoder 200 may be linear operations, the encoder 200 may be implemented using different schemes which are equivalent to each other. For example, according to a first example scheme, the encoder 200 may use the second activation of the systematic encoder 203 to produce the output codeword $c_{out}$, by injecting the input vector i with $i[\alpha]=i'$ and $i[\beta]=b$.

Figure 5:
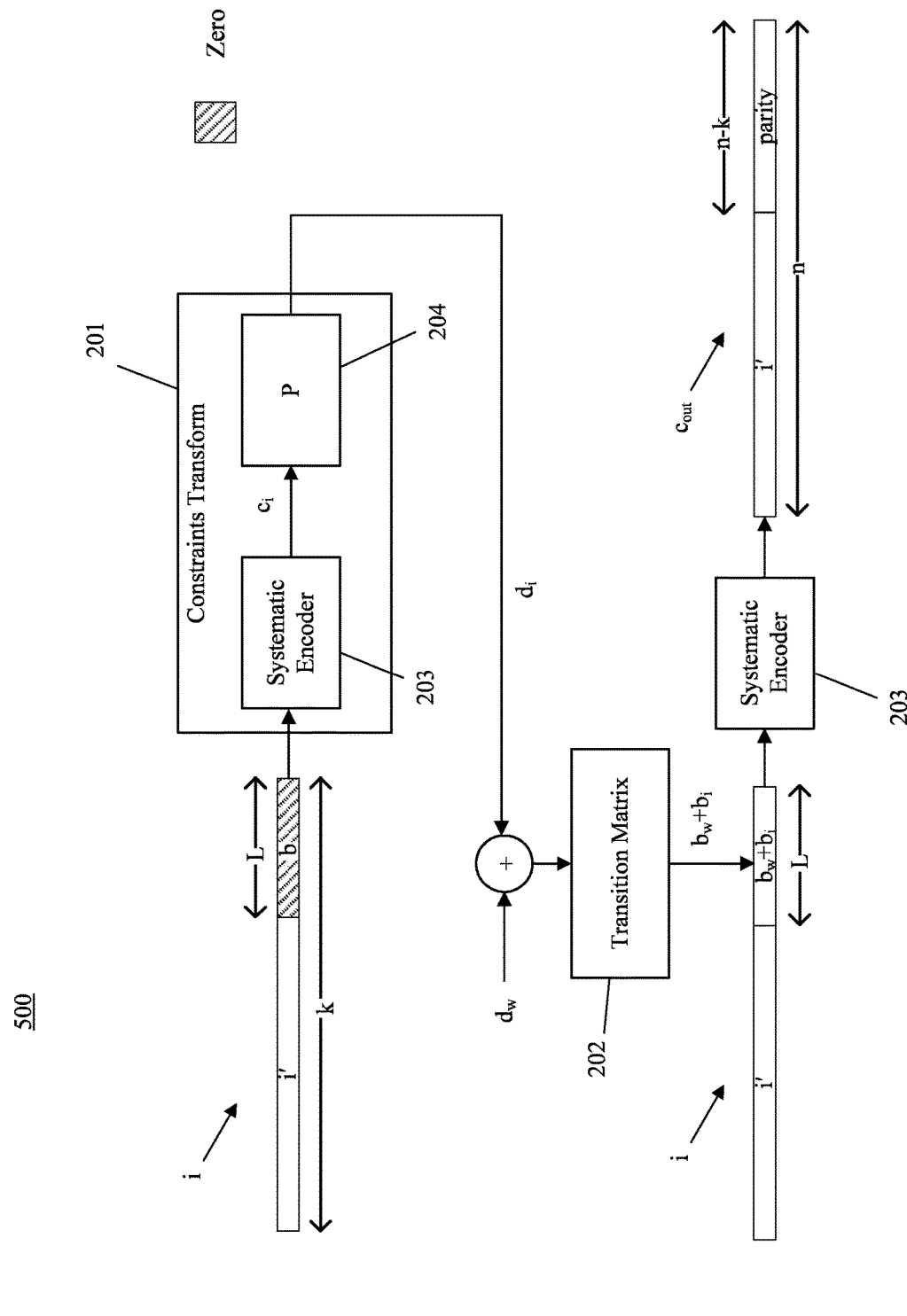
FIG. 5 is a block diagram of an encoder for encoding information bits to generate an output codeword according to a first example scheme, according to embodiments.

FIG. 5 is a block diagram of an example of an encoder 500 for encoding information bits to generate an output codeword according to the first example scheme, according to embodiments. In embodiments, the encoder 500 may correspond to the encoder 200, and may include a constraints transform module 201, a transition matrix module 202, a systematic encoder 203, and a constraints matrix module 204.

Figure 6:
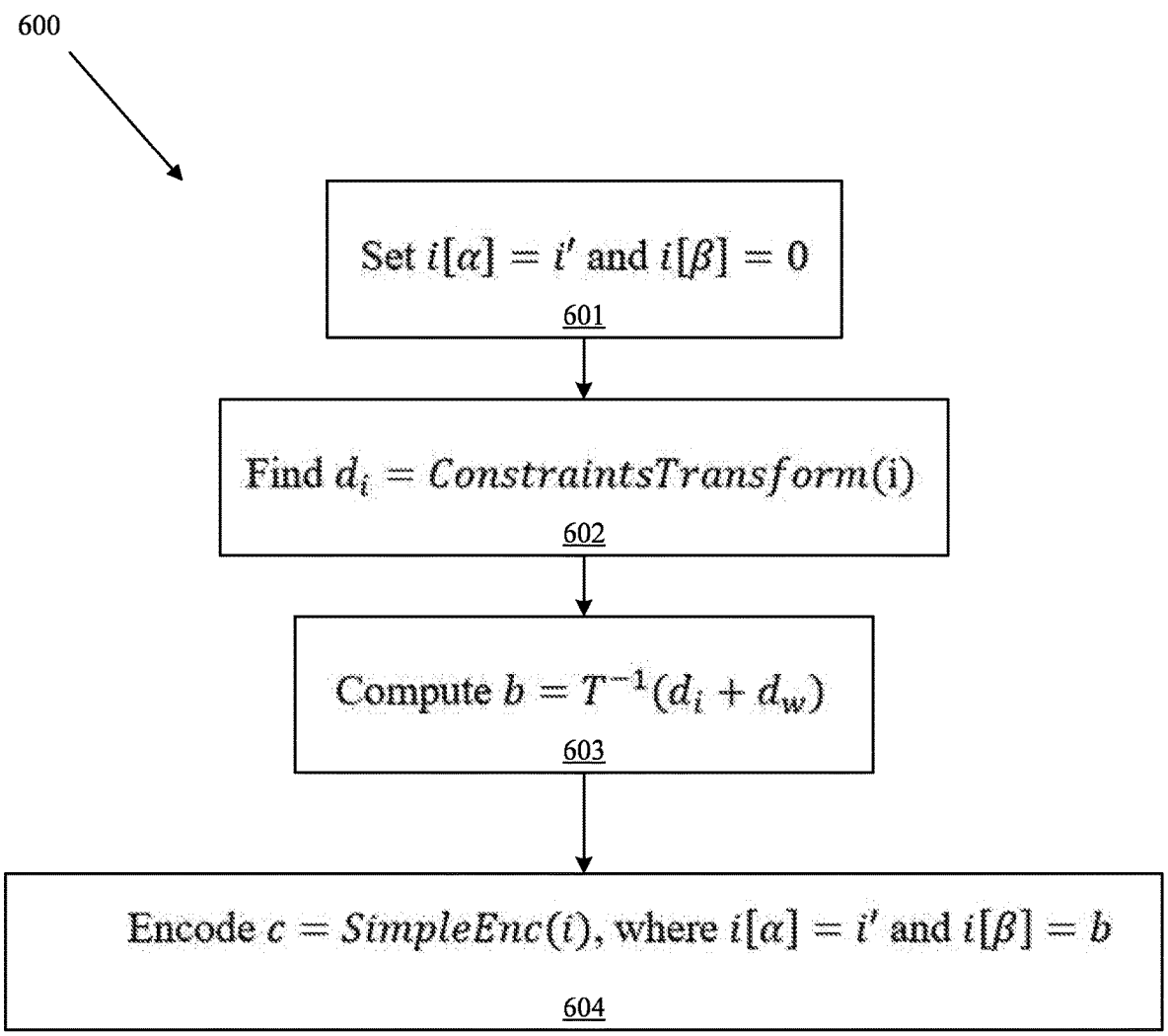
FIG. 6 is a flowchart of a process for generating an output codeword using the encoder of FIG. 5, according to embodiments.

FIG. 6 is a flowchart of a process 600 for generating an output codeword using the encoder 500, according to embodiments. Referring to FIGS. 5 and 6, at operation 601, the process 600 may include placing the information vector i' into the input vector i, and setting the balance bits b to zero. At operation 602, the process 600 may include computing the preliminary constraints vector $d_i$ using the constraints transform module 201. At operation 603, the process 600 may include computing the balance bits b (e.g., corresponding to $b_w + b_i$ shown in FIG. 5) based on the preliminary constraints vector $d_i$ and the target constraints vector $d_w$ using the transition matrix module 202. At operation 604, the process 600 may include updating the input vector i to include the balance bits b along with the information vector i', and using the systematic encoder 203 to encode the updated input vector i to generate the output codeword $c_{out}$.

In embodiments, the output codeword $c_{out}$ generated according to the process 600 may be included in $C_0$ because it is an output of the systematic encoder 203, and may be included in $C_1$ because the balance bits b are determined based on the constraints matrix P and the target constraints vector $d_w$.

As another example, according to a second example scheme, the encoder may use the first activation of the systematic encoder 203, occurring for example during the operation of the constraints transform module 201, to compute the preliminary codeword $c_i$, which may be referred to as a first preliminary codeword. The encoder 200 may then use the second activation of the systematic encoder 203 to compute a preliminary codeword $c_b$, which may be referred to as a second preliminary codeword, by injecting the input vector i with $i[\alpha]=0$ and $i[\beta]=b$. The encoder 200 may then add the preliminary codeword $c_i$ to the preliminary codeword $c_b$ to obtain the output codeword $c_{out}$. In embodiments, the preliminary codeword $c_i$ may represent the impact of the information vector i' on the output codeword $c_{out}$, and the preliminary codeword $c_b$ may represent the impact of the balance bits b on the output codeword $c_{out}$.

Figure 7:
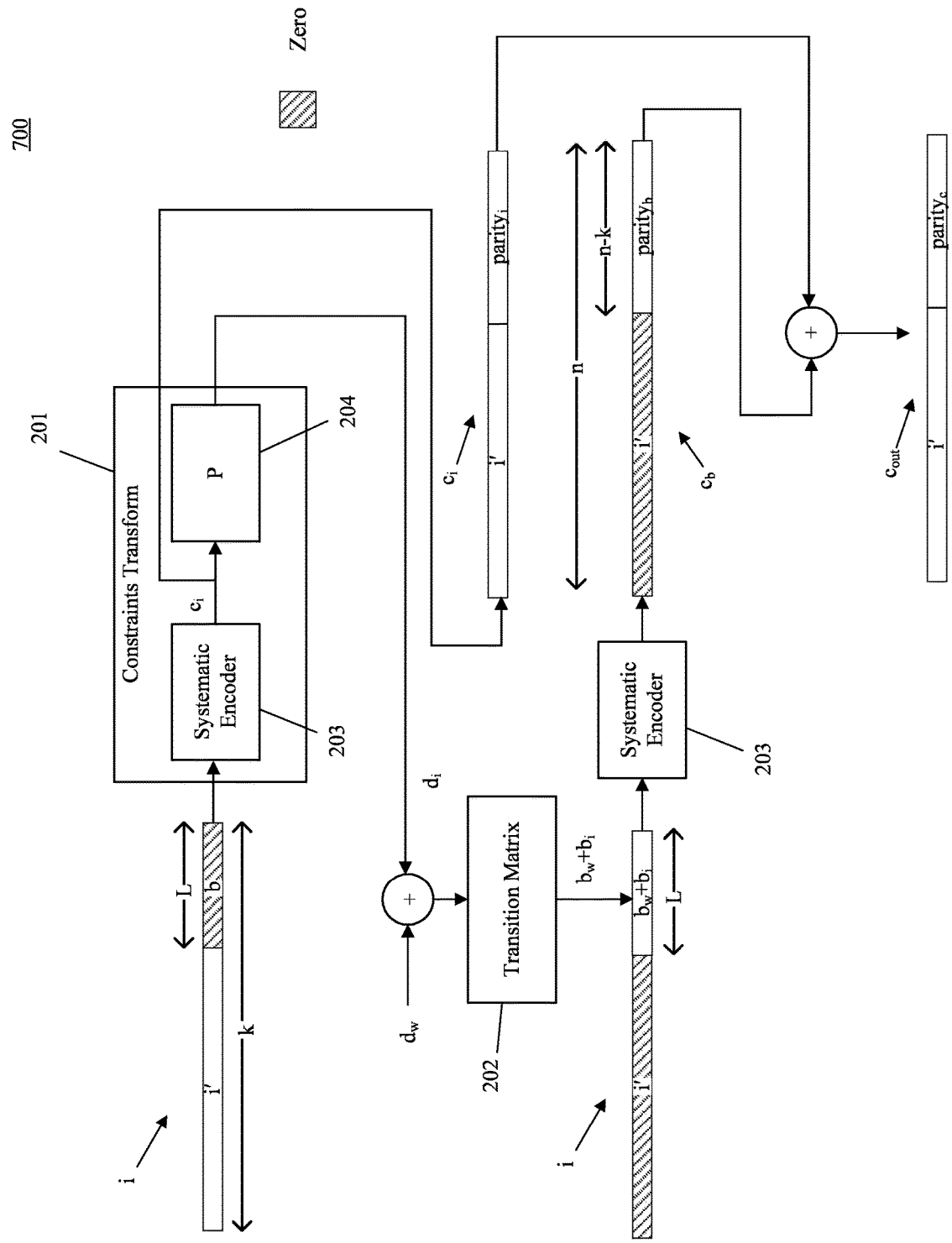
FIG. 7 is a block diagram of an encoder for encoding information bits to generate an output codeword according to a second example scheme, according to embodiments.

FIG. 7 is a block diagram of an example of an encoder 700 for encoding information bits to generate an output codeword according to the second example scheme, according to embodiments. In embodiments, the encoder 700 may correspond to the encoder 200, and may include a constraints transform module 201, a transition matrix module 202, a systematic encoder 203, and a constraints matrix module 204.

Figure 8:
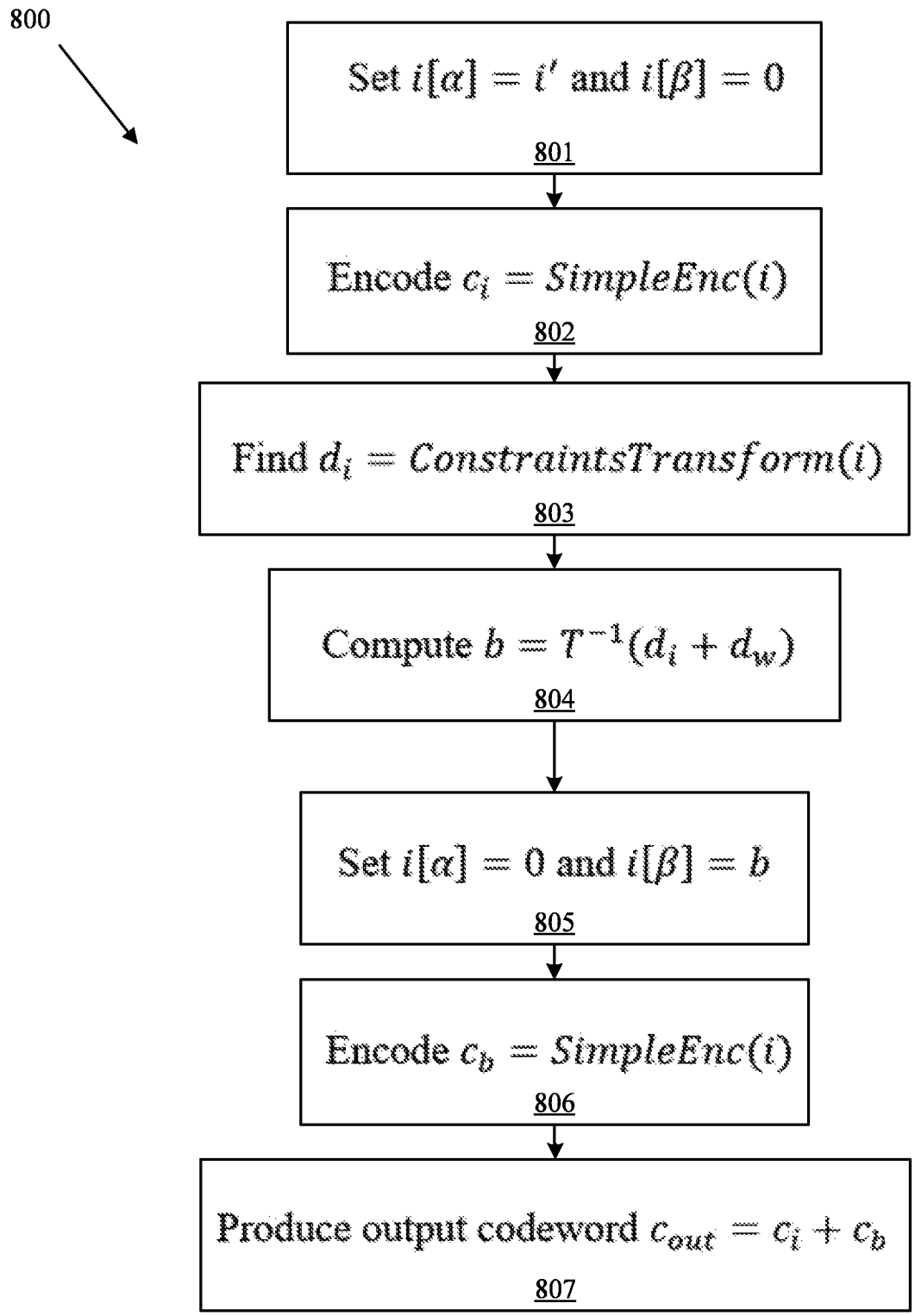
FIG. 8 is a flowchart of a process for generating an output codeword using the encoder of FIG. 7, according to embodiments.

FIG. 8 is a flowchart of a process 800 for generating an output codeword using the encoder 700, according to embodiments. Referring to FIGS. 7 and 8, at operation 801, the process 800 may include placing the information vector i' into the input vector i, and setting the balance bits b to zero. At operation 802, the process 800 may include encoding the input vector i to obtain the preliminary codeword $c_i$ using the systematic encoder 203. At operation 803, the process 800 may include computing the preliminary constraints vector $d_i$ using the constraints transform module 201. At operation 804, the process 800 may include computing the balance bits b based on the preliminary constraints vector $d_i$ and the target constraints vector $d_w$ using the transition matrix module 202. At operation 805, the process 800 may include updating the input vector i by placing the balance bits b into the input vector i, and setting the information vector i' to zero. At operation 806, the process 800 may include encoding the updated input vector i to obtain the preliminary codeword $c_b$ using the systematic encoder 203. At operation 806, the process 800 includes generating the output codeword $c_{out}$ by obtaining a sum of the preliminary codeword $c_i$ and the preliminary codeword $c_b$.

In embodiments, the output codeword $c_{out}$ generated according to the process 800 may be included in $C_0$ because it is the sum of outputs of the systematic encoder 203, and may be included in $C_1$ because the balance bits b are determined based on the constraints matrix P and the target constraints vector $d_w$. In embodiments, the second scheme may be useful in situations where there is an advantage in zeroing some of the inputs of the systematic encoder 203.

In embodiments, at least one of the encoder 200, the encoder 500, and the encoder 700 may be used to perform encoding according to various different coding techniques, specific examples of which are discussed in greater detail below.

FIGS. 9A to 9E are block diagrams for explaining a generalized concatenated code (GCC) coding technique, according to embodiments. FIGS. 10A and 10B are flowcharts of a process 1000A and a process 1000B for generating an output codeword according to the GCC coding technique using at least one of the encoder 200 and the encoder 500, according to embodiments.

Figure 9A:
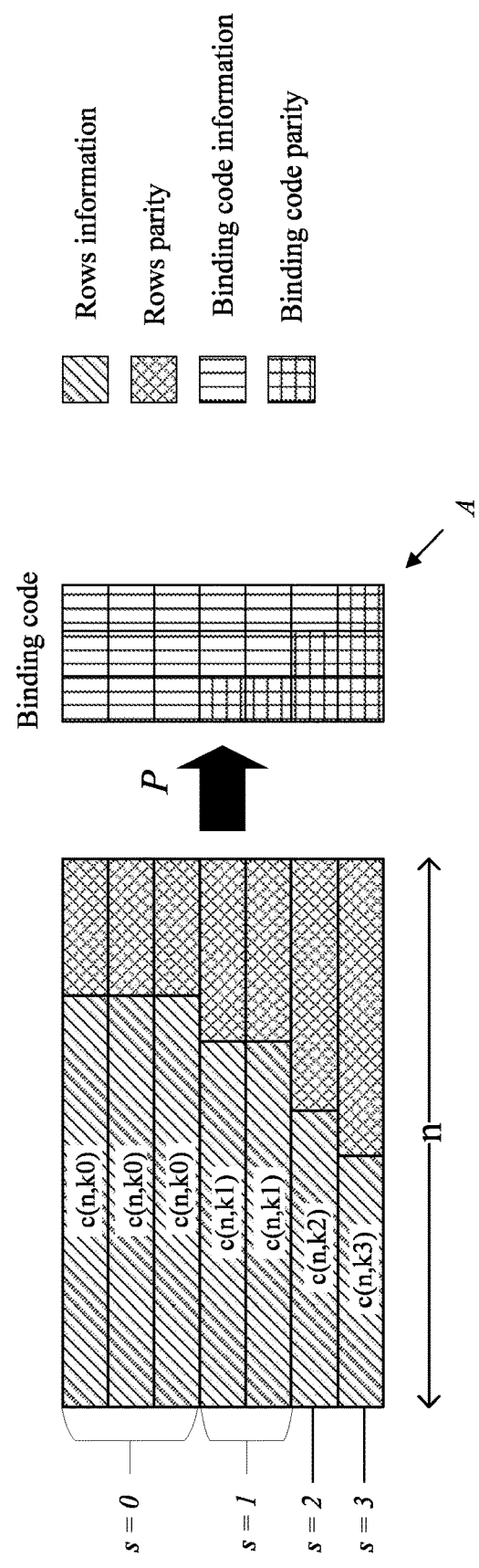
FIGS. 9A to 9E are block diagrams for explaining a generalized concatenated code (GCC) coding technique, according to embodiments.
Figure 10A:
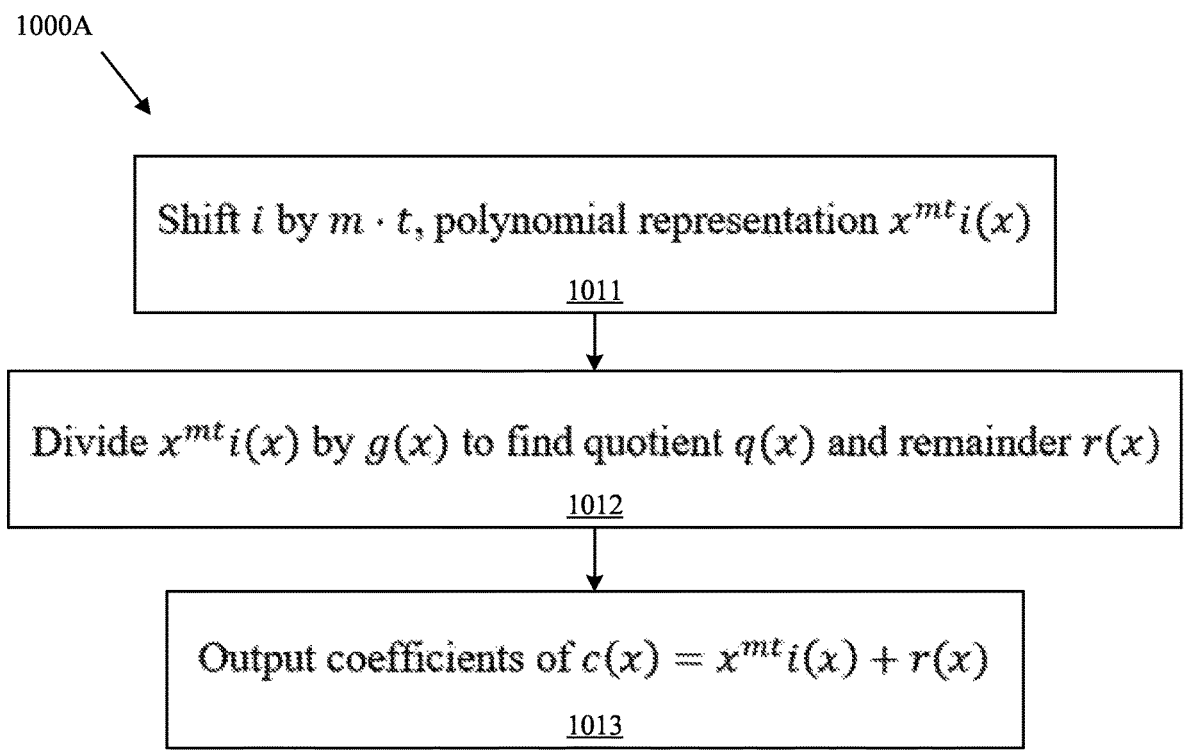
FIGS. 10A and 10B are flowcharts of example processes for generating an output codeword according to the GCC coding technique, according to embodiments.
Figure 10B:
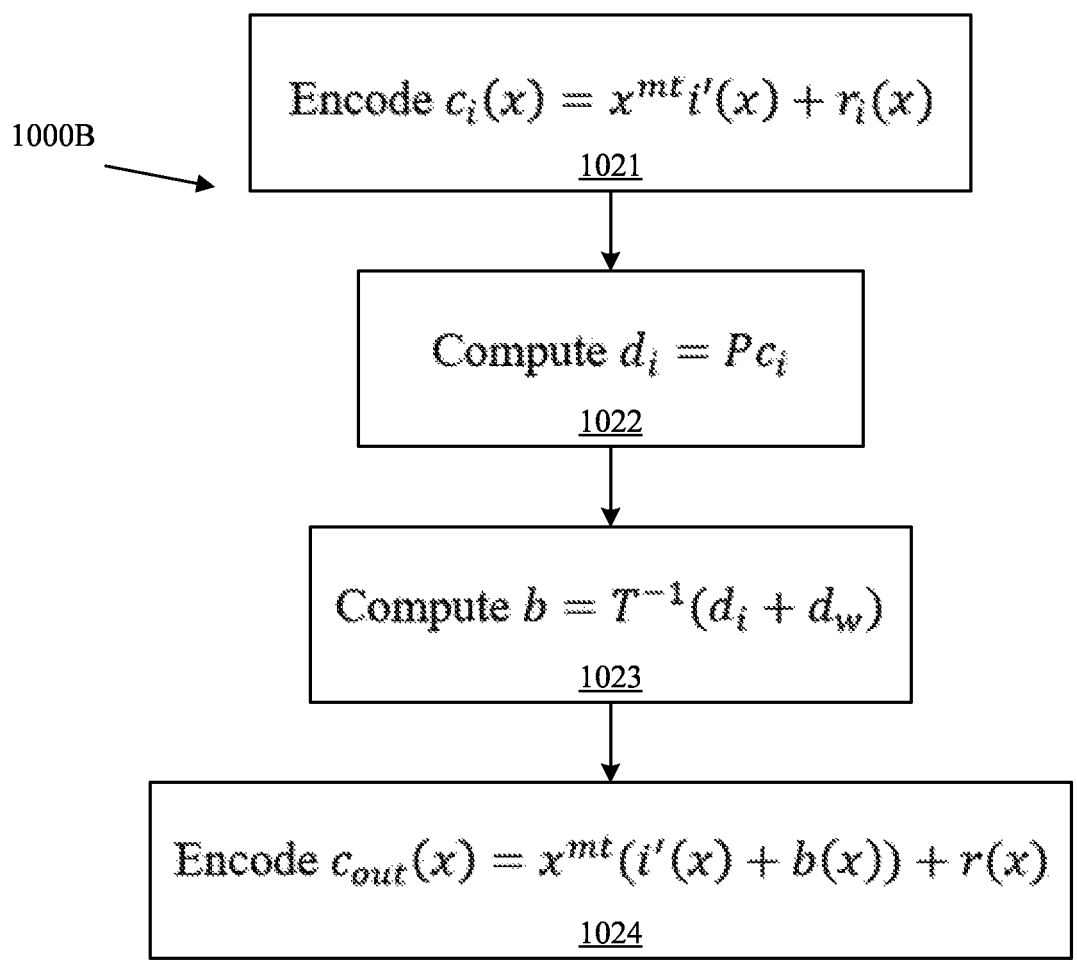

FIG. 9A illustrates a two dimensional structure in which rows of codewords c are bonded together by a different code according to the GCC coding technique. In embodiments, the GCC coding technique may require that the rows of the codewords c meet a joint constraint represented by the binding code. For example, as shown in FIG. 9A, all rows may have the same length n but different dimensions k. For example, each of the codewords c may include n bits, of which k bits are information bits, and n−k bits are parity bits. According to the GCC coding technique, the rows of codewords c may be grouped into S stages by their dimensions, such that a stage s contains all words $c(n, k_s)$.

In embodiments, each codeword c may be multiplied by the constraints matrix P and produce a row of symbols in an auxiliary matrix A. In embodiments, based on the GCC coding technique being used, the constraints matrix P may be a GCC transform matrix. The columns of the auxiliary matrix A may be codewords in a binding code of the GCC coding technique. The number of columns may be at least S−1, and each column may be associated with a stage and have the same number of information symbols as the number of rows in that stage.

Figure 9B:
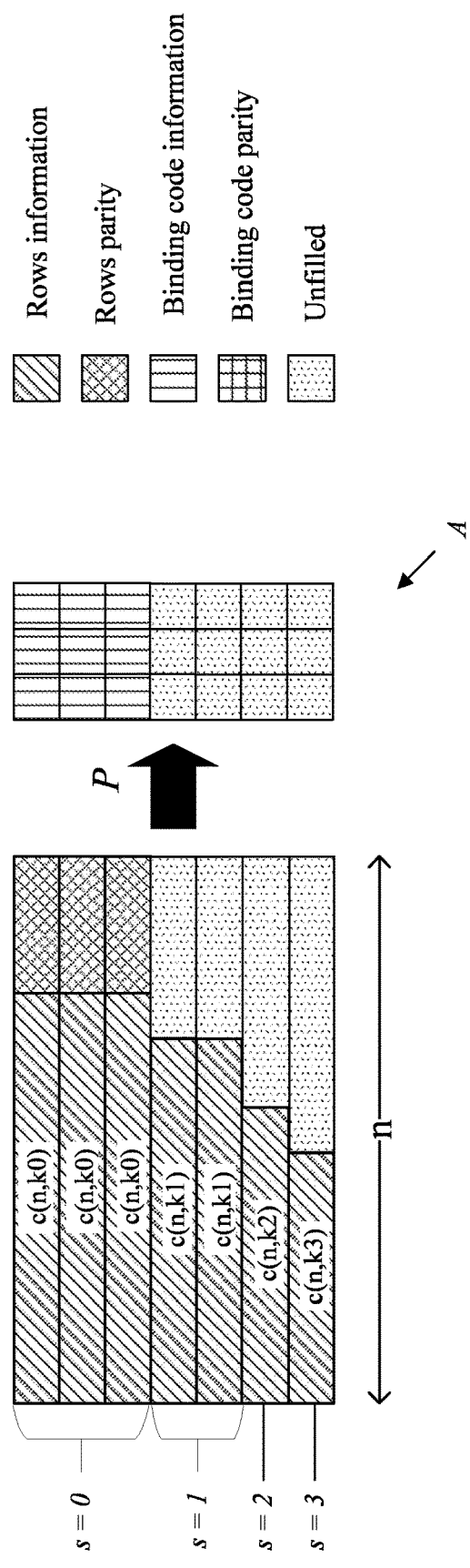
Figure 9C:
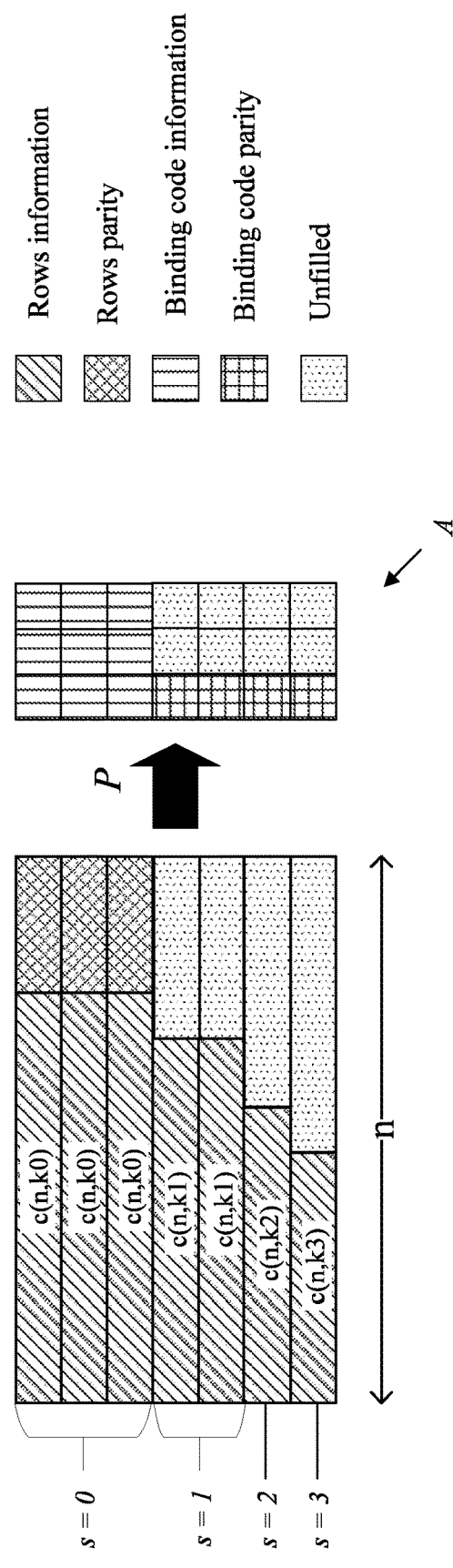

FIG. 9B shows a result of encoding the first stage, s=0. After all rows of the stage s=0 are encoded, the encoder 200 may apply the constraints matrix P and obtain all of the information symbols of the corresponding columns in the auxiliary matrix A. Then, the encoder 200 may encode the column symbols of the stage s and obtain binding code parity symbols, as shown in FIG. 9C.

Figure 9D:
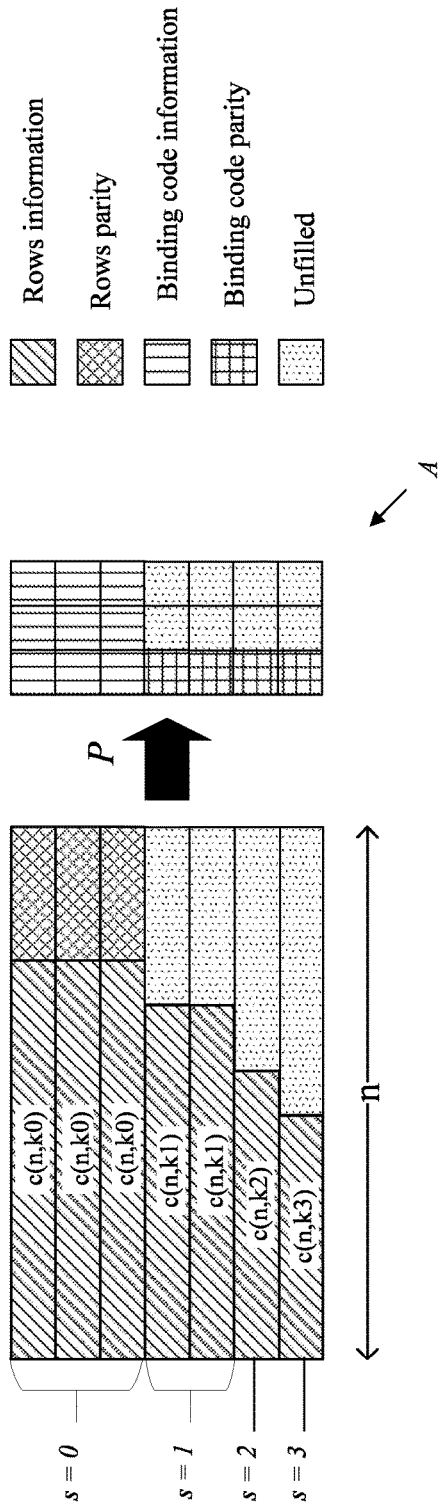
Figure 9E:
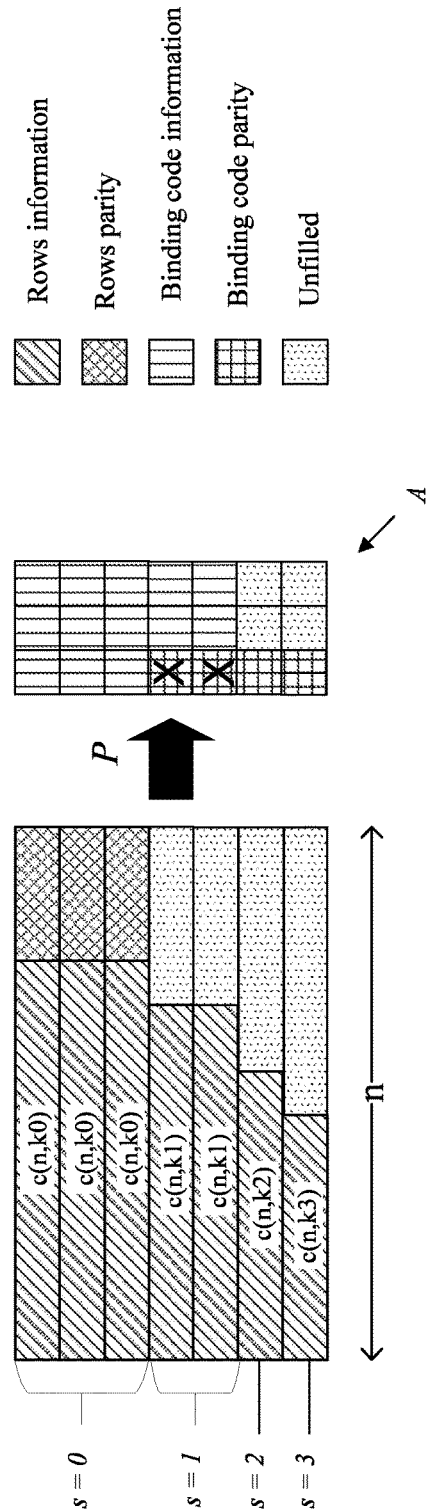

FIG. 9D shows a result of encoding the second stage, s=1. After all rows of the stage s=0 are encoded, the encoder 200 may apply the constraints matrix P and obtain all of the information symbols of the corresponding columns in the auxiliary matrix A. Then, the encoder 200 may encode the column symbols of the stage s and obtain binding code parity symbols. However, as shown in FIG. 9E, the binding code parity symbols marked "X" have already been determined, as discussed above. For example, the symbols marked "X" may be parity symbols of the binding code, and are also required to be the results of applying the constraints matrix P to the corresponding rows.

In embodiments, this conflict may be resolved by adding affine constraints Pc=d to the codes of the rows, where the constraints vector d may be determined based on the auxiliary matrix A.

As an example, the rows of the GCC coding technique may be encoded using a Bose-Chaudhuri-Hocquenghem (BCH) code. For integers $$m \geq 3 \text{ and } t \leq \frac{2^m}{m},$$

there may exist a binary BCH code with parameters according to Equation 7 and Equation 8 below:

$$n = 2^m - 1 \qquad \text{Equation 7}$$

$$k = n - mt \qquad \text{Equation 8}$$

This BCH code may be capable of correcting any combination of t or fewer errors. A codeword c may be a BCH codeword if its polynomial representation can be divided by the code's generator polynomial g(x) with no remainder. For example, A codeword c may be a BCH codeword if there exists a polynomial q(x) which satisfies Equation 9 below:

$$c(x) = q(x)g(x) \qquad \text{Equation 9}$$

FIG. 10A shows an example of a process 1000A for applying a systematic BCH code to an input vector i, according to embodiments. In embodiments, process 1000A may be performed by the systematic encoder 203.

As shown in FIG. 10A, at operation 1011, the process 1000A may include shifting the input vector i and obtaining a corresponding polynomial representation $x^{m-t}i(x)$. At operation 1012, the process 1000A may include dividing the polynomial representation by the generator polynomial g(x) to obtain the quotient q(x) and remainder r(x). At operation 1013, the process 1000A may include outputting the coefficients of the polynomial representation $x^{m'}i(x)$, the quotient $q(x)$ and remainder $r(x)$.

In embodiments, the GCC constraints may be enforced on the BCH word according to Equation 10 below:

$$P_{L \times n} \cdot c_{n \times 1} = d_{L \times 1} \quad \text{Equation 10}$$

In Equation 10, L may represent the size (number of bits) of a symbol of the binding code multiplied by the number of parity symbols in the auxiliary matrix rows of stage s.

FIG. 10B shows an example of a process 1000B for generating an output codeword $c_{out}$ corresponding to the GCC coding technique using a BCH code, as discussed above. In embodiments, the process 1000B may be performed by at least one of the encoder 200, the encoder 500, and any of the elements included therein. The process 1000B may receive as input the information vector i' (having a polynomial representation i'(x)) and the target constraints vector $d_w$. In embodiments, the target constraints vector $d_w$ may be determined based on parity symbols from the auxiliary matrix A. Predetermined parameters may be determined for the process 1000B in advance, for example the constraints matrix P and the inverse transition matrix $T^{-1}$. In embodiments, the constraints matrix P may correspond to a GCC transform matrix associated with the GCC coding technique.

As shown in FIG. 10B, at operation 1021, the process 1000B may include encoding the information vector i' using a systematic BCH encoder to obtain a preliminary codeword $c_i$. At operation 1022, the process 1000B may include computing the preliminary constraints vector $d_i$ by applying the constraints matrix P to the preliminary codeword $c_i$. At operation 1023, the process 1000B may include computing the balance bits b based on the preliminary constraints vector $d_i$ and the target constraints vector $d_w$. At operation 1024, the process 1000B may include obtaining a sum of the information vector i' and the balance bits b, and encoding the sum using the systematic BCH encoder to obtain an output codeword $c_{out}$. In embodiments, the systematic BCH encoder may correspond to the systematic encoder 203, and operations 1021 and 1024 may be performed according to process 1000A discussed above.

Figure 11A:
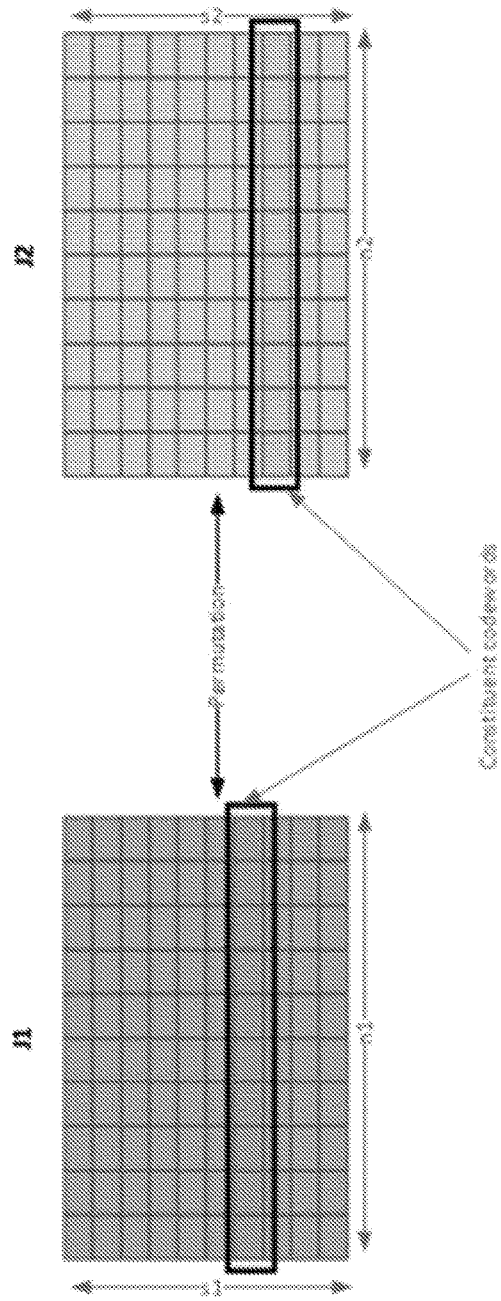
FIGS. 11A and 11B are diagrams for explaining a generalized low-density parity-check (GLDPC) coding technique, according to embodiments.
Figure 11B:
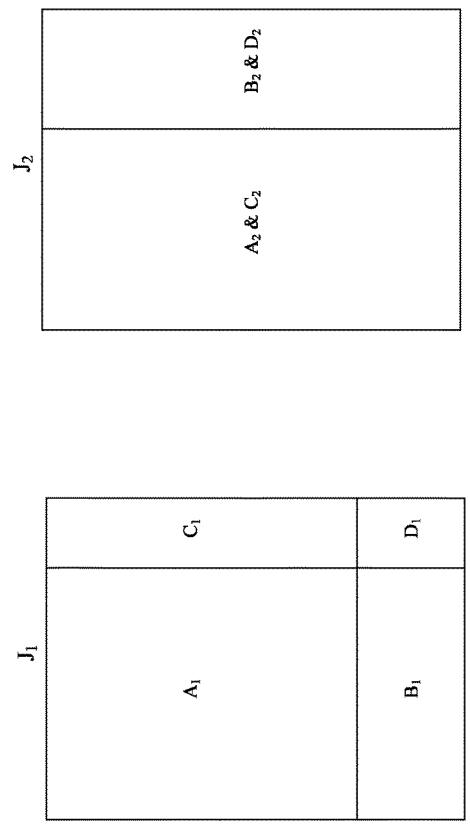
Figure 12A:
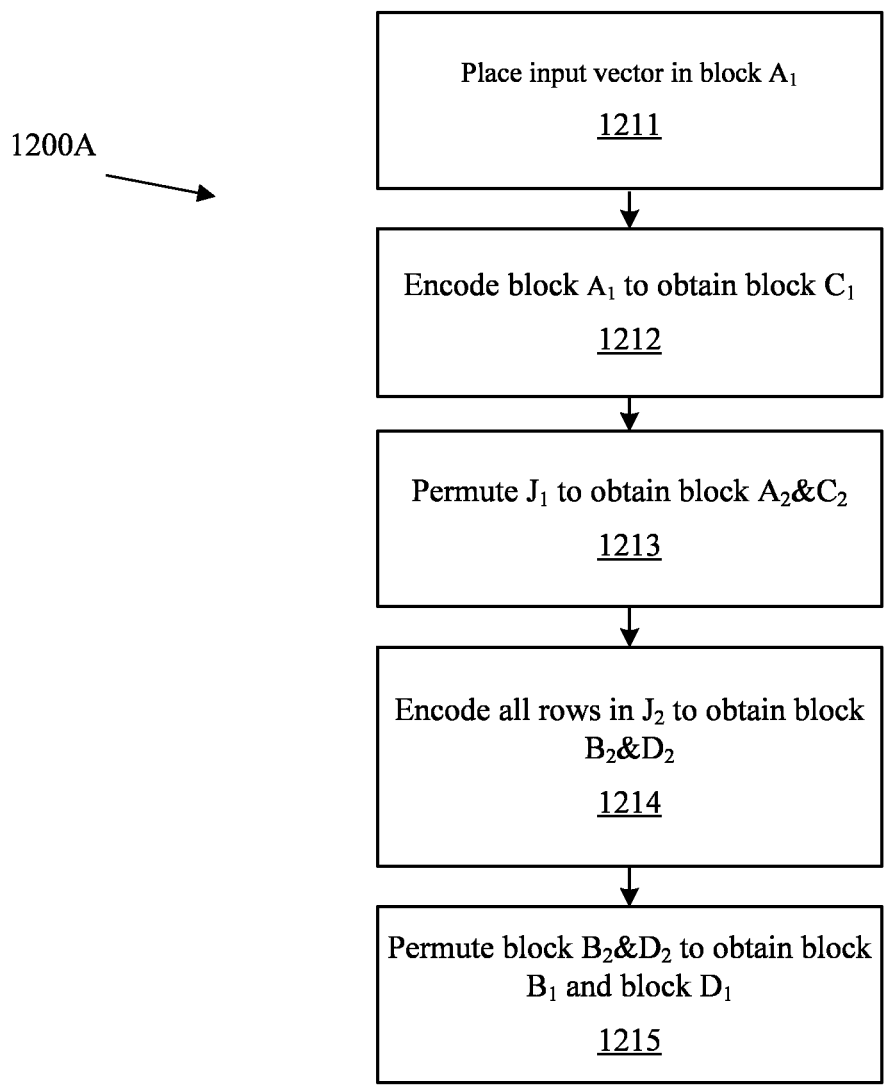
FIGS. 12A and 12B are flowcharts of example processes for generating an output codeword according to the GLDPC coding technique, according to embodiments.
Figure 12B:
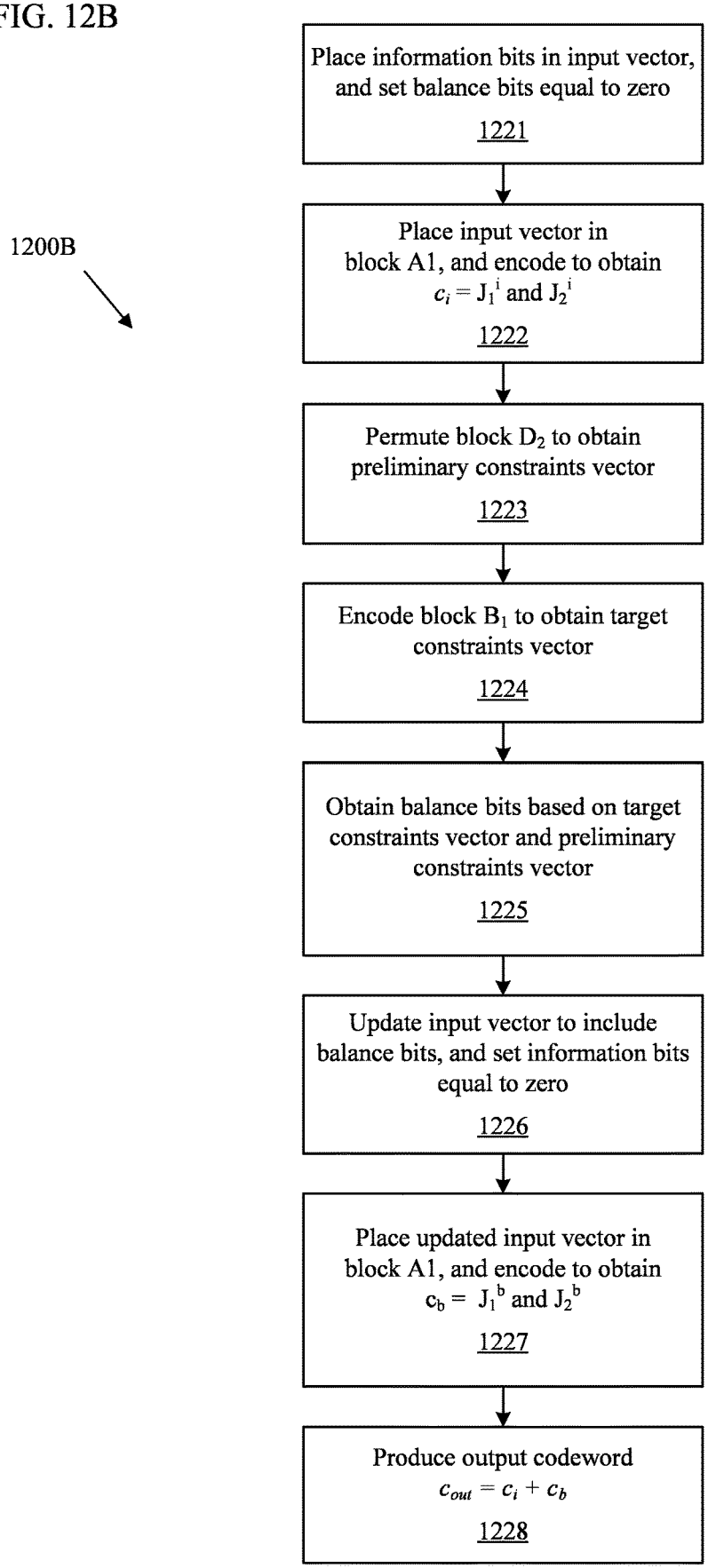

FIGS. 11A and 11B are diagrams for explaining a generalized low-density parity-check (GLDPC) coding technique, according to embodiments. FIGS. 12A and 12B are flowcharts of a process 1200A and a process 1200B for generating an output codeword according to the GLDPC coding technique using at least one of the encoder 200 and the encoder 700, according to embodiments, and FIGS. 13A to 13D are diagrams for explaining the process 1200A and the process 1200B, according to embodiments.

In embodiments, a GLDPC codeword of length N may be represented in two different arrangements, illustrated in FIG. 11A as arrangement $J_1$ and arrangement $J_2$. These two arrangements may have a specific known bijective mapping between them, which may be represented using Equation 11 and Equation 12 below:

$$J_2 = \Pi \cdot J_1 \quad \text{Equation 11}$$

$$J_1 = \Pi^{-1} \cdot J_2 \quad \text{Equation 12}$$

Both arrangements may correspond to column N×1, but have rectangle representation with s rows and n columns, such that N=s·n.

In embodiments, each row of each arrangement of the GLDPC codeword may be a shortened Hamming codeword ($n=2^m$, $k_H=2^m-m-1$) for some m, such that $n=2^m$, $k_H=2^m-m-1$. In embodiments, the shortened Hamming codewords may be referred to as constituent codewords. As a result, all $s_1$ rows in $J_1$ and all $s_2$ rows in $J_2$ block representation are Hamming codewords.

Therefore, in order to check that a codeword c is a GLDPC codeword, the codeword c may be arranged into an arrangement $J_1$, which may be a rectangle $s_1 \times n_1$, and the $s_1$ rows may be checked to determine whether they are all Hamming codewords. Then, the arrangement $J_1$ may be permuted using the permutation $\Pi$ into an arrangement $J_2$, which may be a rectangle $s_2 \times n_2$, and the $s_2$ rows may be checked to determine whether they are all Hamming codewords as well.

In embodiments, a GLDPC coding technique may be performed using at least one of the encoder 200 and the encoder 700 using the processes discussed above. For example, the GLDPC code may be interpreted as a subcode of a simple systematic code, an example of which is described below.

For example, based on implementing the GLDPC coding technique, the systematic encoder 203, which may be a simple systematic encoder, may receive the input vector i as input, and may output a codeword $c \in C_0$. In embodiments, the codeword c may be a codeword of length N, and may include s rows of length n. In embodiments, the codeword c may be arranged in the arrangement $J_1$ and the arrangement $J_2$, where all rows in arrangement $J_2$ are constituent Hamming codewords, and $J_2 = \Pi \cdot J_1$. However, in embodiments the systematic encoder 203 may not be able to ensure that all rows of the arrangement $J_1$ are constituent Hamming codewords, and therefore the set $C_0$ may include codewords which are not GLDPC codewords. FIG. 11B illustrates an example in which the arrangement $J_1$ and the arrangement $J_2$ are partitioned into blocks according to the simple systematic code associated with the GLDPC coding technique.

FIG. 12A shows an example of a process 1200A for applying a simple systematic code associated with the GLDPC coding technique to an input vector i, according to embodiments. In embodiments, process 1200A may be performed by the systematic encoder 203. Predetermined parameters may be determined for the process 1200A in advance, for example indexes sets for the blocks illustrated in FIG. 11B.

As shown in FIG. 12A, at operation 1211, the process 1200A may include placing the input vector i into block $A_1$. At operation 1212, the process 1200A may include encoding the block $A_1$ to obtain block $C_1$. For example, the block $C_1$ may be determined such that all of the rows in block $A_1$ and block $C_1$ are Hamming codewords. At operation 1213, the process 1200A may include permuting the arrangement $J_1$ to obtain block $A_2\&C_2$. In embodiments, bits included in block $A_2\&C_2$ may be interleaved, and therefore the block $A_2\&C_2$ may be unable to be separated into separate blocks. However, the bits indexes of bits in $A_2$ and bits in $C_2$ may be known. At operation 1214, the process 1200A may include encoding all rows in arrangement $J_2$ to obtain block $B_2\&D_2$. In embodiments, bits included in block $B_2\&D_2$ may be interleaved, and therefore the block $B_2\&D_2$ may be unable to be separated into separate blocks. However, the bits indexes of bits in $B_2$ and bits in $D_2$ may be known. At operation 1215, the process 1200A may include permuting block $B_2$&$D_2$ to obtain block $B_1$ and block $D_1$.

Therefore, as a result of the process 1200A, the systematic encoder 203 may output a codeword c which may have an arrangement $J_1$ and an arrangement $J_2$, such that all $s_2$ rows of the arrangement $J_2$ may be constituent Hamming codewords, only some of the rows of the arrangement $J_1$ may be Hamming codewords, and $J_2 = \Pi \cdot J_1$. For example, in the arrangement $J_1$ produced according to the process 1200A, only $s_i < s_1$ rows, which may be rows which contain bits of the input vector i, may be Hamming codewords, and the remaining $s_x = s_1 - s_i$ rows may include rows which are not Hamming codewords.

According to the GLDPC coding technique, all rows of the arrangement $J_1$ must be Hamming codewords, which the process 1200A may not be able to provide. Therefore, according to embodiments, this requirement may be added as a set of linear constraints, as discussed above. For example, according to a Hamming code, a Hamming parity matrix $H_{(n-k_H)\times n}$ may be applied to a word r, and the word r may be a Hamming codeword if Equation 13 below is satisfied:

$$H \cdot r = 0 \qquad \text{Equation 13}$$

Therefore, according to embodiments, linear constraints in the form of $P \cdot c = d$ may be applied to codeword c output by the process 1200A, with the constraints matrix P expressed according to Equation 14 below:

$$P = \left[ 0_{(n-k_H)s_x \times (n-k_H)} | I_{s_x} \otimes H \right] \qquad \text{Equation 14}$$

In Equation 14 above, $\otimes$ may represent the Kronecker matrix product operator, $I_{s_x}$ may represent a matrix including $s_x$ input vectors, and the constraints vector d may be expressed according to Equation 15 and Equation 16 below:

$$d = 0_L \qquad \text{Equation 15}$$

$$L = (n - k_H)s_x \qquad \text{Equation 16}$$

For example, based on the codeword c including $s_i$ Hamming codewords of length n, followed by $s_x = s_1 - s_i$ rows which are not Hamming codewords, the constraints matrix P may be used to address only the rows which are not Hamming codewords. For example, each word $r_j$, $j \geq s_i$ may be multiplied by H, and the result may be determined according to Equation 17 below:

$$P \cdot c = \left[ 0_{(n-k_H)s_x \times (n-k_H)} \middle| \begin{array}{ccccc} H_{n-k_H \times n} & 0 & \cdots & \cdots & 0 \\ 0 & H & \ddots & & \vdots \\ \vdots & \ddots & \ddots & \ddots & \vdots \\ \vdots & & \ddots & H & 0 \\ 0 & \cdots & \cdots & 0 & H \end{array} \right] \qquad \text{Equation 17}$$

$$\begin{bmatrix} r_0 \\ r_1 \\ \vdots \\ \vdots \\ r_{(s_i-1)} \\ r_{s_i} \\ \vdots \\ r_{s_1} \end{bmatrix}_{(ns_1 \times 1)} = 0_{(n-k_H)s_x}$$

FIG. 12B shows an example of a process 1200B for generating an output codeword $c_{out}$ corresponding to the GLDPC coding technique, as discussed above. In embodiments, the process 1200 may be performed by at least one of the encoder 200, the encoder 700, and any of the elements included therein. The process 1200B may receive as input the information vector i'. Predetermined parameters may be determined for the process 1200B in advance, for example indexes sets for the blocks illustrated in FIG. 11B.

Figure 13A:
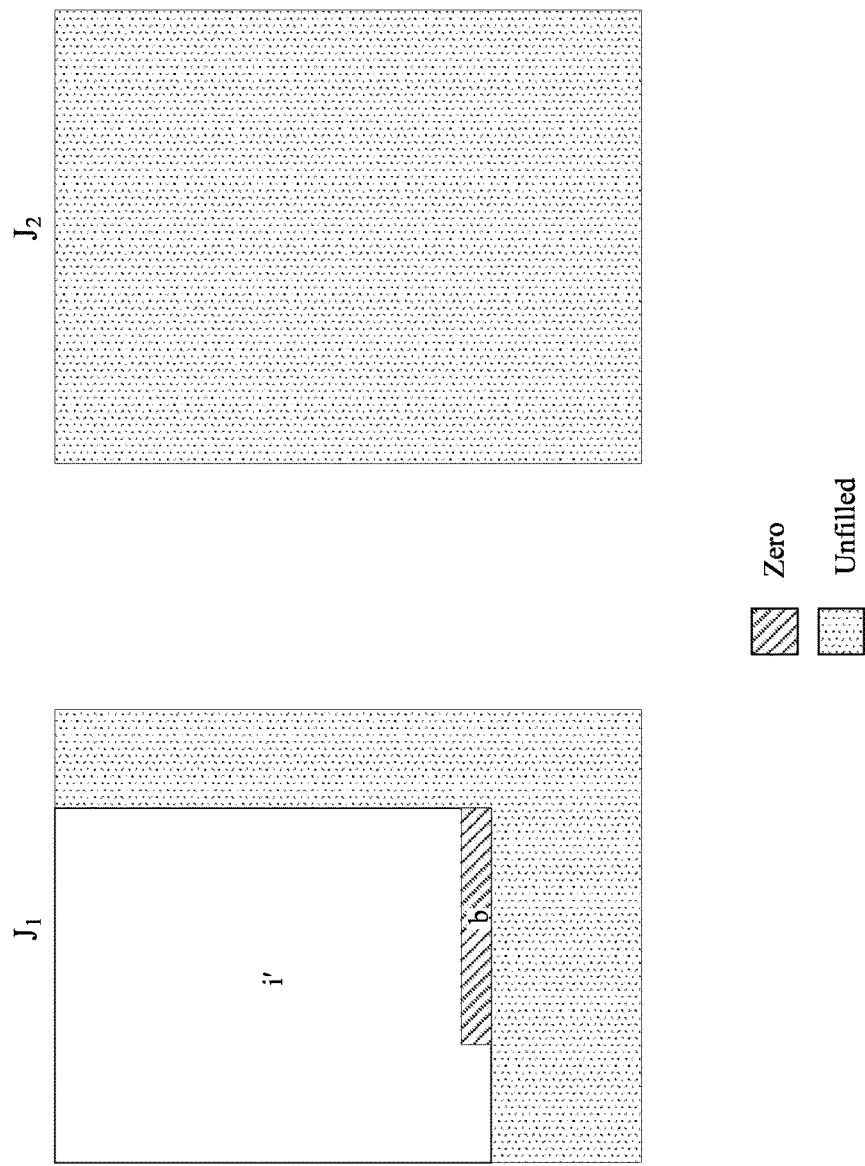
FIGS. 13A to 13D are diagrams for explaining the example processes of FIGS. 12A and 12B, according to embodiments.

As shown in FIG. 12B, at operation 1221, the process 1200B may include placing the information vector i' into the input vector i, and setting the balance bits b to zero. At operation 1222, the process 1200B may include placing the input vector i in block $A_1$ such that $i[\alpha] = i'_{k-L}$, and $i[\beta] = 0$. In embodiments, L bits from block $A_1$ may be designated to be the balance bits b, as shown in FIG. 13A.

Figure 13B:
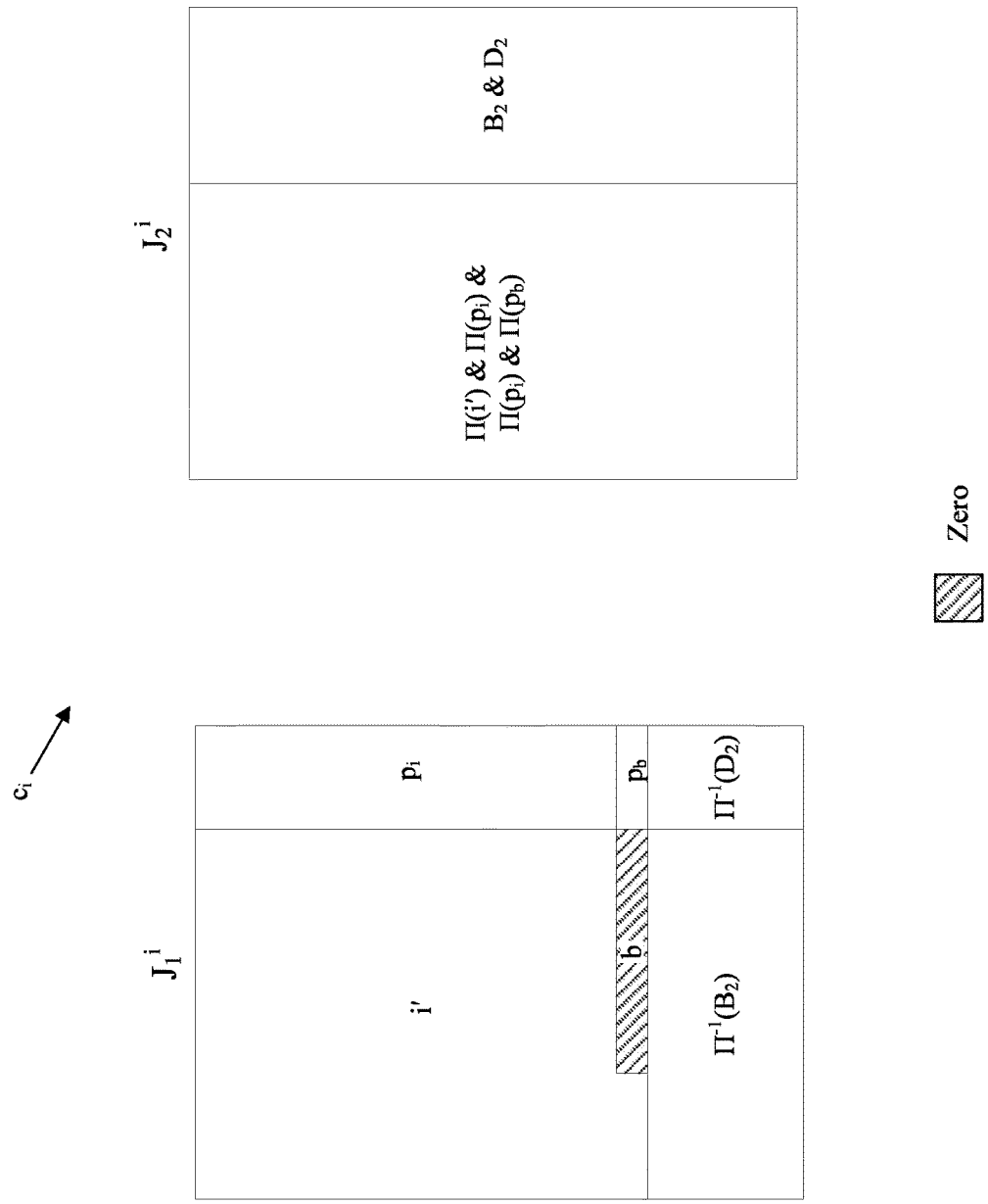

At operation 1222, the process 1200B may include encoding the input vector i to obtain preliminary codeword $c_i$, which may be arranged according to arrangement $J_1^i$ and arrangement $J_2^i$ as shown in FIG. 13B. In embodiments, operation 1222 may be performed according to process 1200A discussed above, and may include for example determining the parity bits $p_b$, which may be parity bits for the rows which include the balance bits b. In embodiments, the parity bits $p_b$ may be affected by changes in the balance bits b, unlike other bits in $C_1$, which may be for example the parity bits $p_i$.

At operation 1223, the process 1200B may include obtaining the preliminary constraints vector $d_i$, which may be determined as the block $D_1$ in arrangement $J_1^i$. In embodiments, the preliminary constraints vector $d_i$ may be produced according to the process 1200A. In embodiments, the preliminary constraints vector $d_i$ may be determined according to Equation 18 below:

$$d_i = \Pi^{-1} \cdot D_2 \qquad \text{Equation 18}$$

At operation 1224, the process 1200B may include performing Hamming encoding on block $B_1$ in the arrangement $J_1^i$ to obtain the target constraints vector $d_w$. In embodiments, the target constraint vector $d_w$ may be determined according to Equation 19 below:

$$d_w = HammingEnc(\Pi^{-1} \cdot B_2) \qquad \text{Equation 19}$$

At operation 1225, the process 1200B may include computing the balance bits b based on the preliminary constraints vector $d_i$ and the target constraint vector $d_w$. In embodiments, the balance bits b may be determined according to Equation 6 discussed above.

At operation 1226, the process 1200B may include updating the input vector to include the balance bits b, and setting the information bits equal to zero.

Figure 13C:
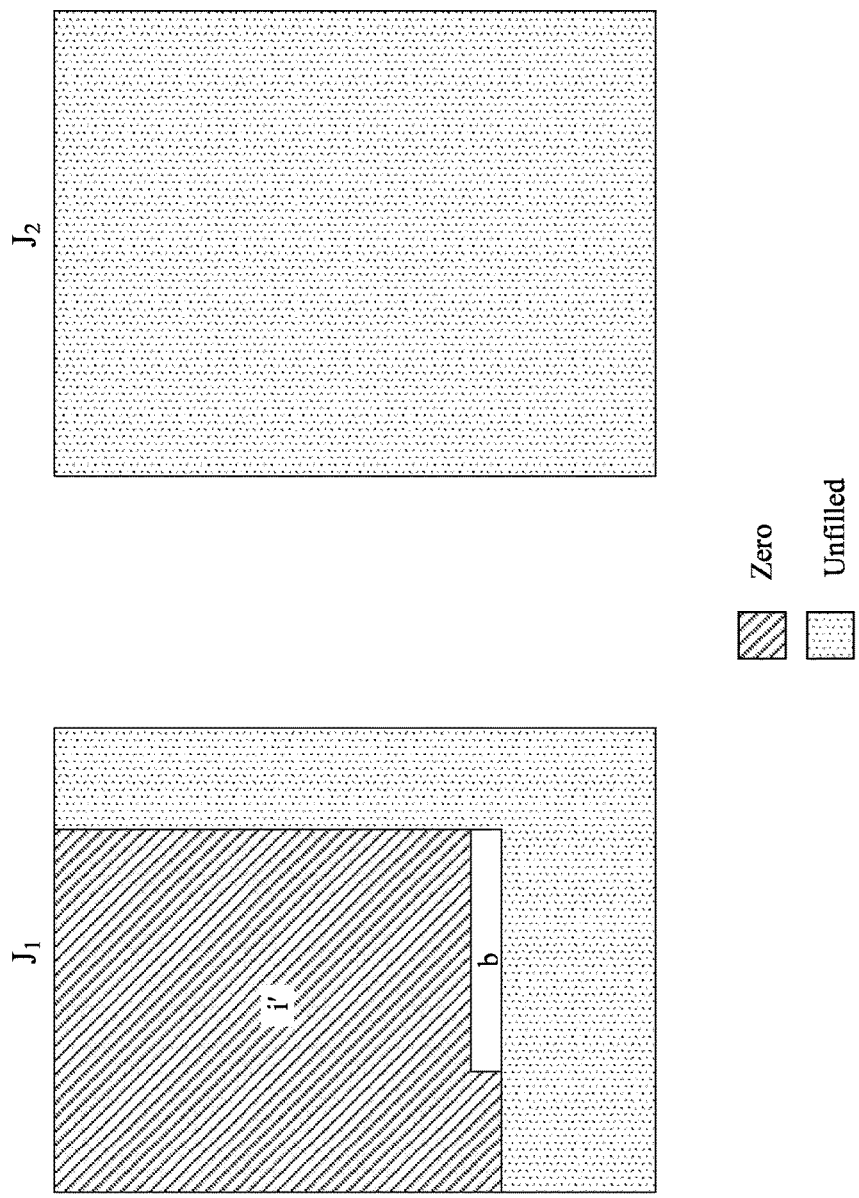
Figure 13D:
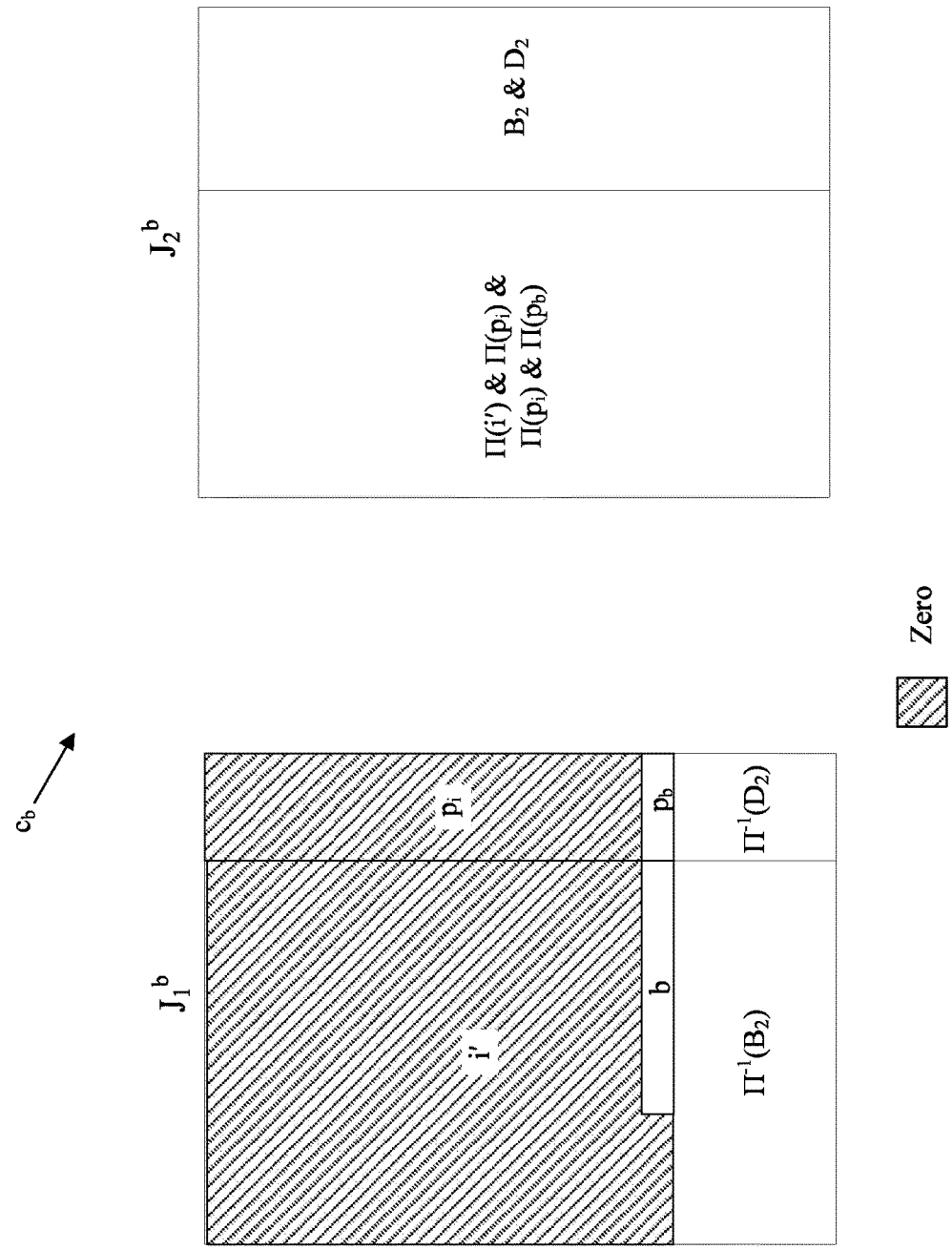

At operation 1227, the process 1200B may include placing the updated input vector i in block $A_1$ such that $i[\alpha]=0$, and $i[\beta]=b$, as shown in FIG. 13C. At operation 1227, the process 1200B may include encoding the input vector i to obtain the preliminary codeword $c_b$, which may be arranged according to arrangement $J_1^b$ and arrangement $J_2^b$ as shown in FIG. 13D. In embodiments, operation 1227 may be performed according to process 1200A discussed above, as shown in FIG. 13D.

At operation 1228, the process 1200B may include obtaining the output codeword $c_{out}$, which may be the sum of the preliminary codeword $c_b$ and the preliminary codeword $c_b$, as shown in Equation 20 below:

$$c_{out} = c_i + c_b \qquad \text{Equation 20}$$

Figure 14A:
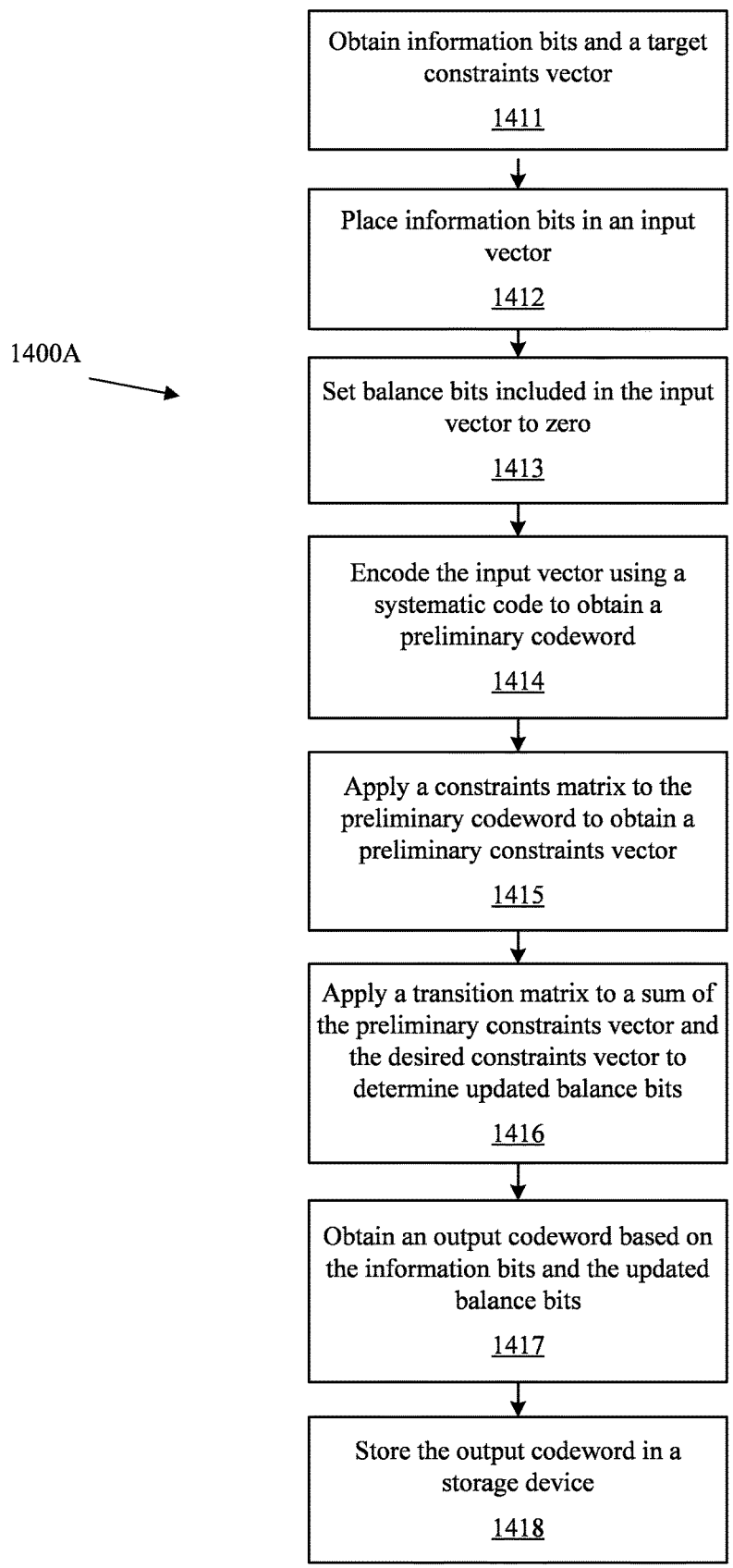
FIGS. 14A, 14B, and 14C are flowcharts of example processes for controlling a storage system, according to embodiments.

FIG. 14A is a block diagram of an example of a process 1400A for controlling a storage system, according to embodiments. In some implementations, one or more process blocks of FIG. 14A may be performed by memory system 1000, or any other element described herein, for example memory controller 100, or encoder 200, encoder 500, encoder 700, or any element included therein.

As shown in FIG. 14A, at operation 1411 the process 1400A may include obtaining information bits and a target constraints vector. In embodiments, the information bits may correspond to bits of the information vector i', and the target constraints vector may correspond to the target constraints vector $d_w$.

As further shown in FIG. 14A, at operation 1412 the process 1400A may include placing the information bits in an input vector. In embodiments, the input vector may correspond to the input vector i.

As further shown in FIG. 14A, at operation 1413 the process 1400A may include setting balance bits included in the input vector to zero. In embodiments, the balance bits may correspond to the balance bits b.

As further shown in FIG. 14A, at operation 1414 the process 1400A may include encoding the input vector using a systematic code to obtain a preliminary codeword. In embodiments, the preliminary codeword may correspond to the preliminary codeword $c_i$.

As further shown in FIG. 14A, at operation 1415 the process 1400A may include applying a constraints matrix to the preliminary codeword to obtain a preliminary constraints vector. In embodiments, the constraints matrix may correspond to the constraints matrix P.

As further shown in FIG. 14A, at operation 1416 the process 1400A may include applying a transition matrix to a sum of the preliminary constraints vector and the target constraints vector to determine updated balance bits. In embodiments, the transition matrix may correspond to at least one of the transition matrix T and the inverse transition matrix $T^{-1}$.

As further shown in FIG. 14A, at operation 1417 the process 1400A may include obtaining an output codeword based on the information bits and the updated balance bits. In embodiments, the output codeword may correspond to the output codeword $c_{out}$.

As further shown in FIG. 14A, at operation 1418 the process 1400A may include storing the output codeword in a storage device. In embodiments, the storage device may correspond to the memory device 110.

Figure 14B:
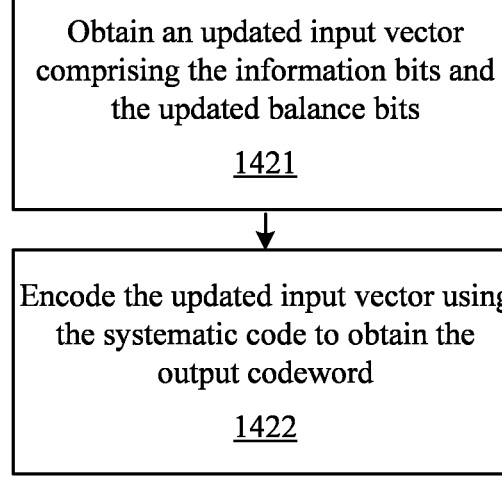

FIG. 14B is a flowchart of a process 1400B for controlling a storage system, according to embodiments. In some implementations, one or more process blocks of FIG. 1400B may be performed by memory system 1000, or any other element described herein, for example encoder 200, encoder 500, or any element included therein.

In embodiments, one or more process blocks of the process 1400B may be performed before, after, or in combination with process blocks of the process 1400A. For example, one or more process blocks of the process 1400B may correspond to operation 1417 of the process 1400A.

As shown in FIG. 14B, at operation 1421 the process 1400B may include obtaining an updated input vector including the information bits and the updated balance bits.

As further shown in FIG. 14B, at operation 1422 the process 1400B may include encoding the updated input vector using the systematic code to obtain the output codeword.

In embodiments, the systematic code may include a BCH code, and the output codeword may include a GCC codeword.

In embodiments, the target constraints vector may include one or more GCC parity symbols, and the constraints matrix may include a GCC transform matrix.

Figure 14C:
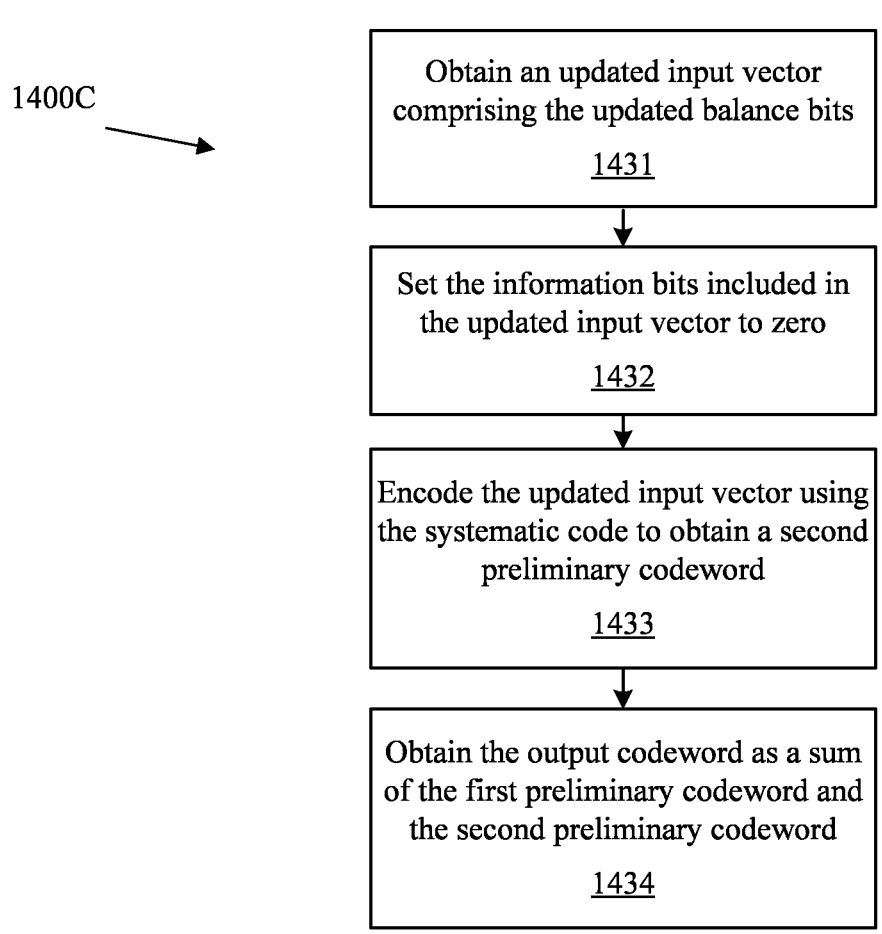

FIG. 14C is a flowchart of a process 1400C for controlling a storage system, according to embodiments. In some implementations, one or more process blocks of FIG. 1400C may be performed by memory system 1000, or any other element described herein, for example encoder 200, encoder 500, or any element included therein.

In embodiments, one or more process blocks of the process 1400C may be performed before, after, or in combination with process blocks of the process 1400A. For example, one or more process blocks of the process 1400C may correspond to operation 1417 of the process 1400A. In embodiments, the first preliminary codeword may correspond to the preliminary codeword of the process 1400A, and the second preliminary codeword may correspond to the preliminary codeword $c_b$.

As shown in FIG. 14C, at operation 1431 the process 1400C may include obtaining an updated input vector including the updated balance bits.

As further shown in FIG. 14C, at operation 1432 the process 1400C may include setting the information bits included in the updated input vector to zero.

As further shown in FIG. 14C, at operation 1433 the process 1400C may include encoding the updated input vector using the systematic code to obtain a second preliminary codeword.

As further shown in FIG. 14C, at operation 1434 the process 1400C may include obtaining the output codeword as a sum of a first preliminary codeword and the second preliminary codeword. In embodiments, the first preliminary codeword may be the preliminary codeword of the process 1400A, which correspond to the preliminary codeword $c_i$, and the second preliminary codeword may correspond to the preliminary codeword $c_b$.

In embodiments, there may exist a bijective mapping between a first arrangement of the output codeword and a second arrangement of the output codeword, and each row of the first arrangement and each row of the second arrangement may include a Hamming codeword Although FIGS. 14A-14C show example blocks of the processes 1400A-1400C, in some implementations, the processes 1400A-1400C may include additional blocks, fewer blocks, different blocks, or differently arranged blocks than those depicted in FIGS. 14A-14C. Additionally, or alternatively, two or more of the blocks of the processes 1400A-1400C may be arranged or combined in any order, or performed in parallel.

Figure 15:
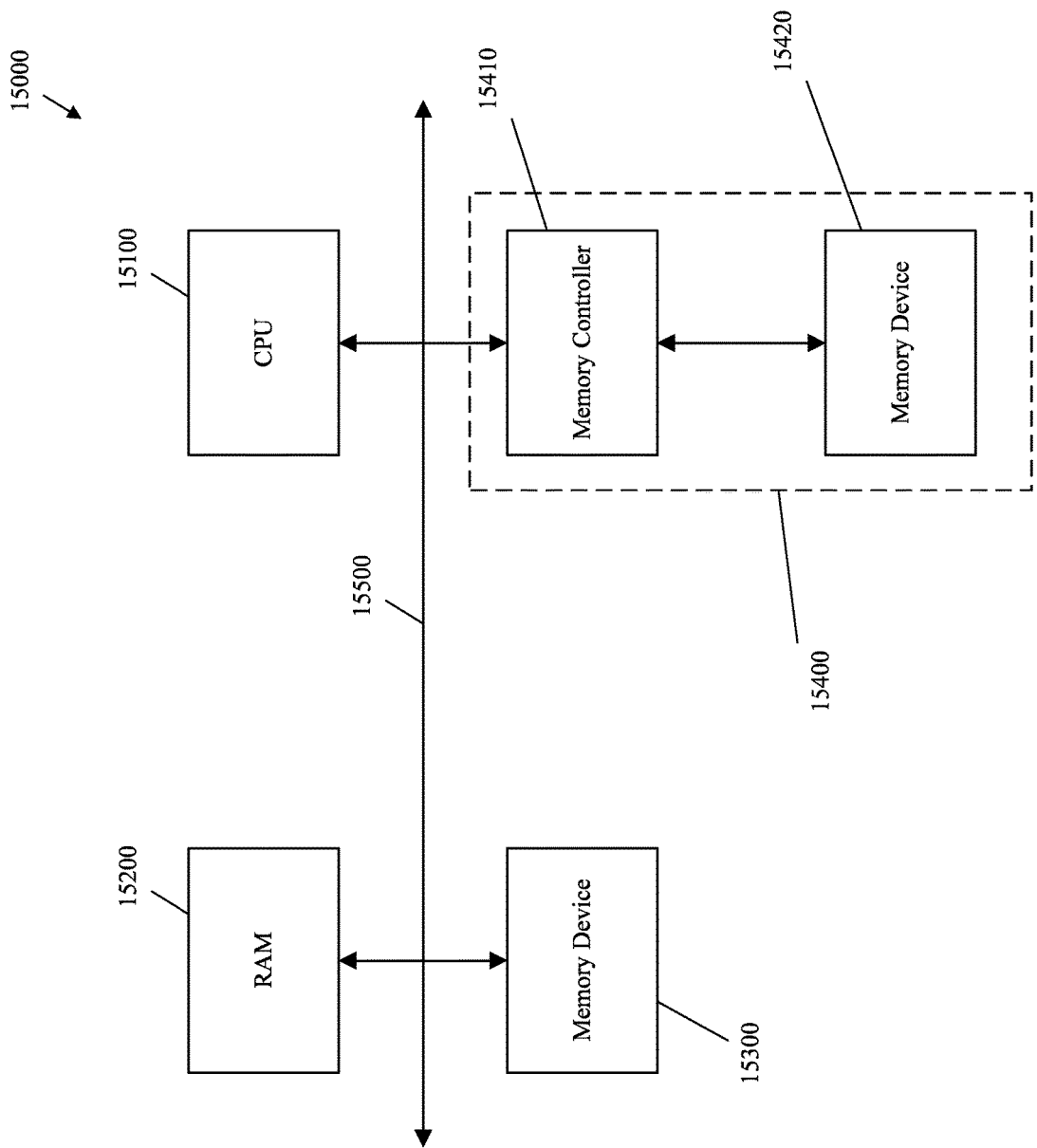
FIG. 15 is a block diagram of computer system including a memory system according to embodiments.

FIG. 15 is a block diagram of a computer system 15000 including a memory system according to embodiments. The computer system 15000, such as a mobile device, a desktop computer, and a server, may employ a memory system 15400 according to embodiments.

The computer system 15000 may include a central processing unit 15100 (illustrated as "CPU"), a RAM 15200, a user interface 15300, and the memory system 15400, are electrically connected to buses 15500. The host as described above may include the central processing unit 15100, the RAM 15200, and the user interface 15300 in the computer system 15000. The central processing unit 15100 may control the entire computer system 15000 and may perform calculations corresponding to user commands input via the user interface 15300. The RAM 15200 may function as a data memory for the central processing unit 15100, and the central processing unit 15100 may write/read data to/from the memory system 15400.

As in example embodiments described above, the memory system 15400 may include a memory controller 15410 and a memory device 15420. The memory controller 15410 may include an encoder and a decoder, and the memory device 15420 may include a cell array including a plurality of memory cells.

According to embodiments, the memory controller 15410 may be implemented by the memory controller 100 discussed above with reference to FIG. 1, and the memory device 15420 may be implemented by the memory device 110 discussed above with reference to FIG. 1.

Figure 16:
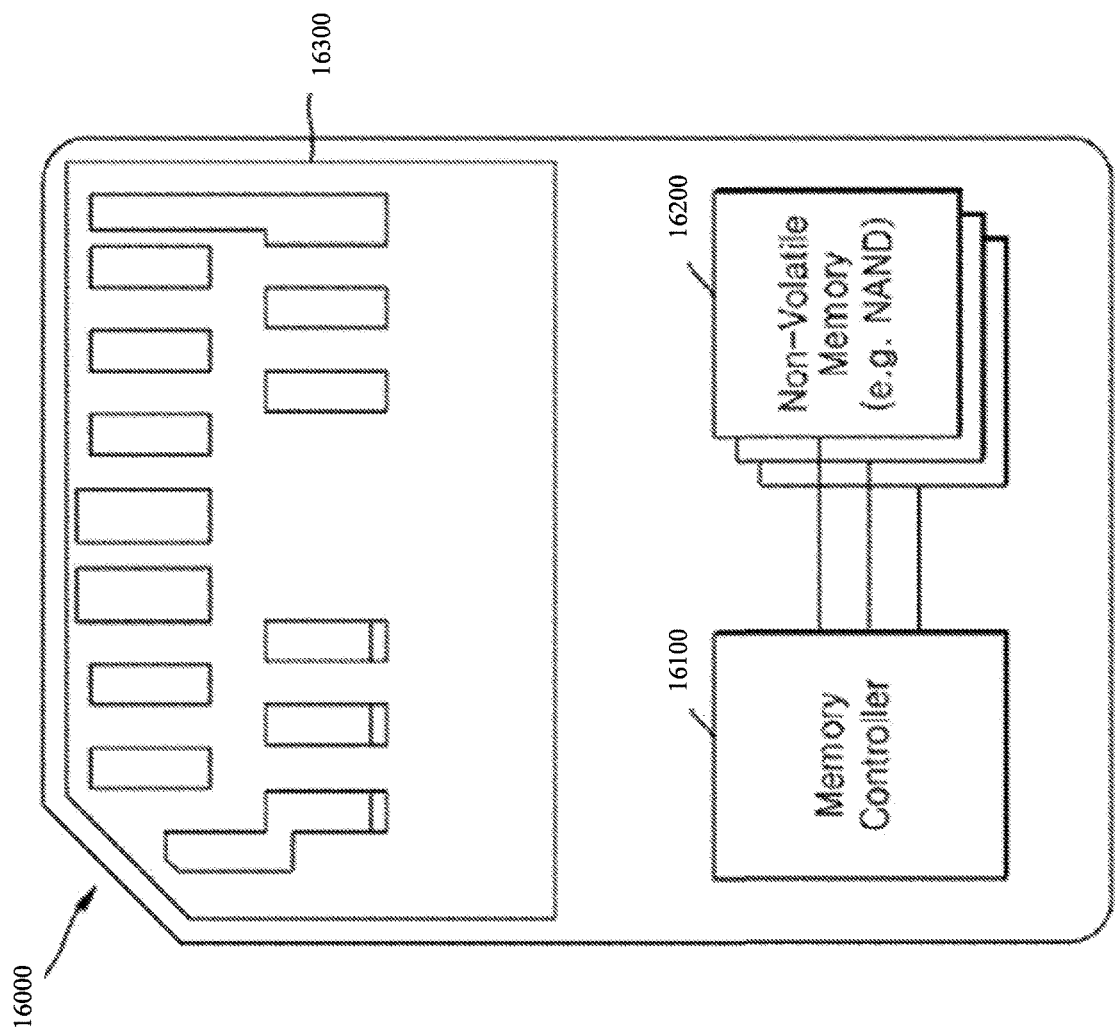
FIG. 16 is a block diagram of a memory card according to embodiments.

FIG. 16 is a block diagram showing a memory card 16000 according to embodiments. The memory system 1000 according to example embodiments discussed above with reference to FIG. 1 may be the memory card 16000. For example, the memory card 16000 may include an embedded multimedia card (eMMC), a secure digital (SD) card, or a Universal Flash Storage (UFS) card. As shown in FIG. 16, the memory card 16000 may include a memory controller 16100, a non-volatile memory 16200, and a port region 16300. The memory controller 16100 may be implemented by the memory controller 100 discussed above with reference to FIG. 1, and the non-volatile memory 16200 shown in FIG. 16 may be implemented by the memory device 110 discussed above with reference to FIG. 1.

The memory controller 16100 may include an encoder and a decoder. The encoder and the decoder may perform an encoding method and a decoding method according to embodiments. The memory controller 16100 may communicate with an external host via the port region 16300 in compliance with a pre-set protocol. The protocol may be eMMC protocol, SD protocol, SATA protocol, SAS protocol, USB protocol, UFS protocol, nonvolatile memory express (NVMe) protocol, peripheral component interconnect express (PCIe) protocol, or compute express link (CXL) protocol. The non-volatile memory 16200 may include memory cells which retain data stored therein even if power supplied thereto is blocked. For example, the non-volatile memory 16200 may include a flash memory, a magnetic random access memory (MRAM), a resistance RAM (RRAM), a ferroelectric RAM (FRAM), or a phase change memory (PCM).

According to embodiments, memory controller 16100 and non-volatile memory 16200 may be implemented, respectively, by the memory controller 100 and the memory device 110 discussed above with reference to FIG. 1.

Figure 17:
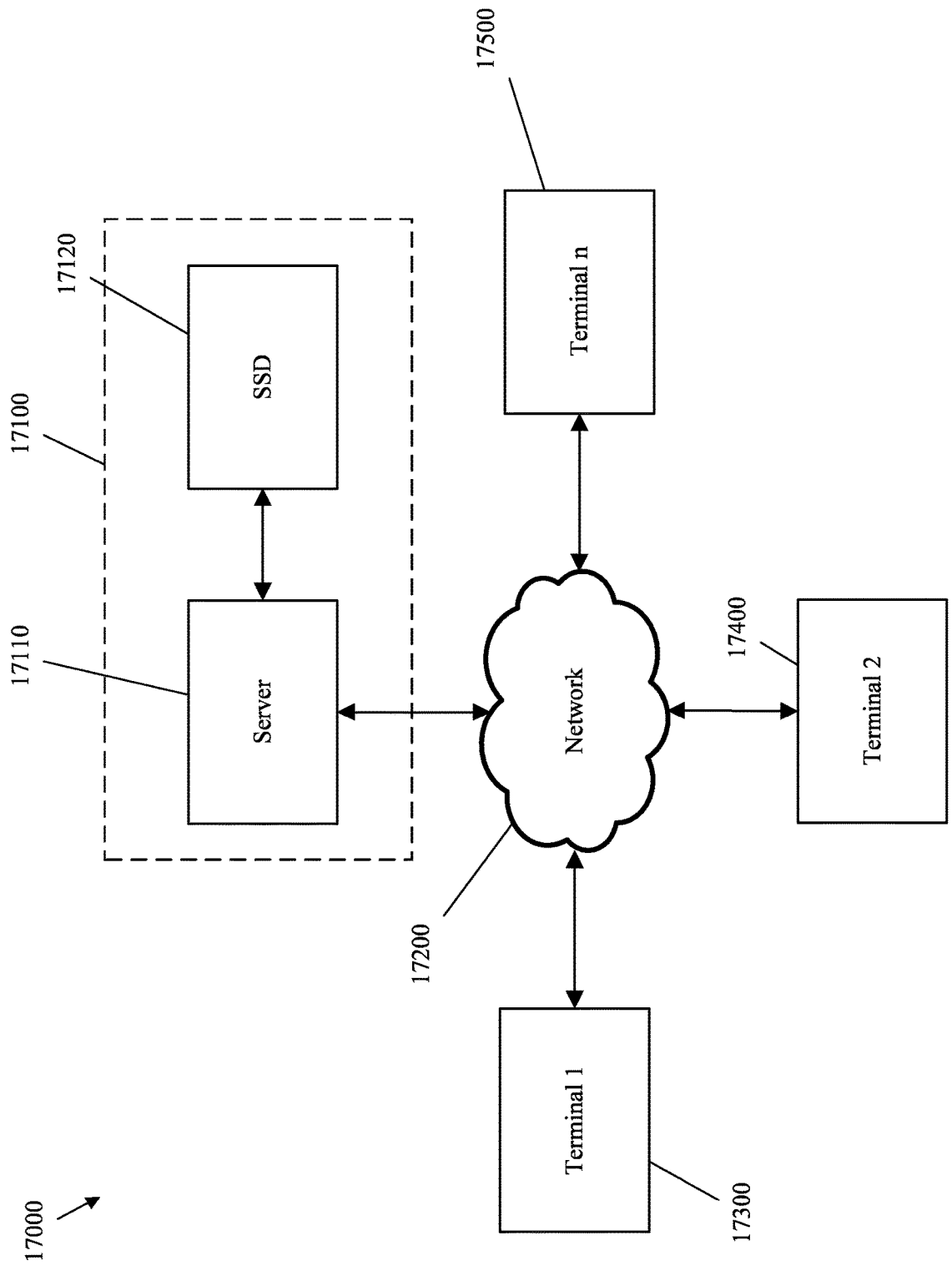
FIG. 17 is a block diagram of a network system including a memory system according to embodiments.

FIG. 17 is a block diagram of a network system 17000 including a memory system according to embodiments. As shown in FIG. 17, the network system 17000 may include a server system 17100 and a plurality of terminals 17300, 17400, and 17500 that are connected via a network 17200. The server system 17100 may include a server 17110 for processing requests received from the plurality of terminals 17300, 17400, and 17500 connected to the network 17200 and an SSD 17120 for storing data corresponding to the requests received from the terminals 17300, 17400, and 17500. Here, the SSD 17120 may be a memory system according to embodiments. For example, in embodiments the SSD 17120 may be implemented by the memory system 1000 discussed above with reference to FIG. 1.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

The various operations of methods described above may be performed by any suitable means capable of performing the operations, such as various hardware and/or software component(s), circuits, and/or module(s).

The software may include an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The foregoing is illustrative of example embodiments and is not to be construed as limiting thereof. Although a few example embodiments have been described, those skilled in the art will readily appreciate that many modifications are possible in the embodiments without materially departing from the present scope.

What is claimed is:

1. A storage system, comprising:
a storage device configured to store a plurality of codewords;
at least one processor configured to:
obtain information bits and a target constraints vector;
place the information bits in an input vector;
set balance bits included in the input vector to zero;
encode the input vector using a systematic code to obtain a preliminary codeword;
apply a constraints matrix to the preliminary codeword to obtain a preliminary constraints vector;
apply a transition matrix to a sum of the preliminary constraints vector and the target constraints vector to determine updated balance bits;
obtain an output codeword based on the information bits and the updated balance bits; and
store the output codeword in the storage device.

2. The storage system of claim 1, wherein to obtain the output codeword, the at least one processor is further configured to:
obtain an updated input vector comprising the information bits and the updated balance bits; and
encode the updated input vector using the systematic code to obtain the output codeword.

3. The storage system of claim 1, wherein the preliminary codeword comprises a first preliminary codeword, and
wherein to obtain the output codeword, the at least one processor is further configured to:
obtain an updated input vector comprising the updated balance bits;
set the information bits included in the updated input vector to zero;
encode the updated input vector using the systematic code to obtain a second preliminary codeword; and
obtain the output codeword as a sum of the first preliminary codeword and the second preliminary codeword.

4. The storage system of claim 1, wherein the systematic code comprises a Bose-Chaudhuri-Hocquenghem (BCH) code, and
wherein the output codeword comprises a generalized concatenated code (GCC) codeword.

5. The storage system of claim 4, wherein the target constraints vector comprises GCC parity symbols, and
wherein the constraints matrix comprises a GCC transform matrix.

6. The storage system of claim 1, wherein there is a bijective mapping between a first arrangement of the output codeword and a second arrangement of the output codeword, and
wherein each row of the first arrangement and each row of the second arrangement comprises a Hamming codeword.

7. The storage system of claim 6, wherein the at least one processor is further configured to:
place the input vector in the first arrangement;
encode the input vector in the first arrangement using the systematic code to obtain a first plurality of bits, wherein the first plurality of bits is included in the first arrangement;
permute the input vector and the first plurality of bits to obtain a second plurality of bits, wherein the second plurality of bits is included in the second arrangement;
encode the second plurality of bits using the systematic code to obtain a third plurality of bits, wherein the third plurality of bits is included in the second arrangement;
permute the third plurality of bits to obtain a fourth plurality of bits and a fifth plurality of bits, wherein the fourth plurality of bits and the fifth plurality of bits are included in the first arrangement; and
encode the fourth plurality of bits using the systematic code to obtain a sixth plurality of bits,
wherein the fifth plurality of bits comprises the preliminary constraints vector, and
wherein the sixth plurality of bits comprises the target constraints vector.

8. A device for encoding information bits for storage in a storage device, the device comprising:
a memory interface configured to communicate with the storage device; and
at least one processor configured to:
obtain the information bits and a target constraints vector;
obtain a preliminary constraints vector by applying a constraints transform to the information bits;
apply a transition matrix to a sum of the preliminary constraints vector and the target constraints vector to obtain balance bits;
obtain an output codeword based on the information bits and the balance bits; and
control the memory interface to transmit the output codeword to the storage device.

9. The device of claim 8, wherein to apply the constraints transform, the at least one processor is further configured to:
place the information bits in an input vector;
encode the input vector using a systematic code to obtain a preliminary codeword; and
apply a constraints matrix to the preliminary codeword to obtain the preliminary constraints vector.

10. The device of claim 9, wherein to obtain the output codeword, the at least one processor is further configured to:
obtain an updated input vector comprising the information bits and the balance bits; and
encode the updated input vector using the systematic code to obtain the output codeword.

11. The device of claim 9, wherein the preliminary codeword comprises a first preliminary codeword, and
wherein to obtain the output codeword, the at least one processor is further configured to:
obtain an updated input vector comprising the balance bits;
set the information bits included in the updated input vector to zero;
encode the updated input vector using the systematic code to obtain a second preliminary codeword; and
obtain the output codeword as a sum of the first preliminary codeword and the second preliminary codeword.

12. The device of claim 9, wherein the systematic code comprises a Bose-Chaudhuri-Hocquenghem (BCH) code, and
wherein the output codeword comprises a generalized concatenated code (GCC) codeword.

13. The device of claim 12, wherein the target constraints vector comprises GCC parity symbols, and
wherein the constraints matrix comprises a GCC transform matrix.

14. The device of claim 9, wherein there is a bijective mapping between a first arrangement of the output codeword and a second arrangement of the output codeword, and
wherein each row of the first arrangement and each row of the second arrangement comprises a Hamming codeword.

15. The device of claim 14, wherein the at least one processor is further configured to:
place the input vector in the first arrangement;
encode the input vector in the first arrangement using the systematic code to obtain a first plurality of bits, wherein the first plurality of bits is included in the first arrangement;
permute the input vector and the first plurality of bits to obtain a second plurality of bits, wherein the second plurality of bits is included in the second arrangement;
encode the second plurality of bits using the systematic code to obtain a third plurality of bits, wherein the third plurality of bits is included in the second arrangement;
permute the third plurality of bits to obtain a fourth plurality of bits and a fifth plurality of bits, wherein the fourth plurality of bits and the fifth plurality of bits are included in the first arrangement; and
encode the fourth plurality of bits using the systematic code to obtain a sixth plurality of bits,
wherein the fifth plurality of bits comprises the preliminary constraints vector, and
wherein the sixth plurality of bits comprises the target constraints vector.

16. A method of controlling a storage system, the method being executed by at least one processor and comprising:
obtaining information bits and a target constraints vector;
placing the information bits in an input vector;
setting balance bits included in the input vector to zero;
encoding the input vector using a systematic code to obtain a preliminary codeword;
applying a constraints matrix to the preliminary codeword to obtain a preliminary constraints vector;
applying a transition matrix to a sum of the preliminary constraints vector and the target constraints vector to determine updated balance bits;
obtaining an output codeword based on the information bits and the updated balance bits; and
storing the output codeword in a storage device.

17. The method of claim 16, wherein the obtaining of the output codeword comprises:
obtaining an updated input vector comprising the information bits and the updated balance bits; and
encoding the updated input vector using the systematic code to obtain the output codeword.

18. The method of claim 16, wherein the preliminary codeword comprises a first preliminary codeword, and
wherein the obtaining of the output codeword comprises:
obtaining an updated input vector comprising the updated balance bits;
setting the information bits included in the updated input vector to zero;
encoding the updated input vector using the systematic code to obtain a second preliminary codeword; and
obtaining the output codeword as a sum of the first preliminary codeword and the second preliminary codeword.

19. The method of claim 16, wherein the systematic code comprises a Bose-Chaudhuri-Hocquenghem (BCH) code, and
wherein the output codeword comprises a generalized concatenated code (GCC) codeword.

20. The method of claim 19, wherein the target constraints vector comprises GCC parity symbols, and
wherein the constraints matrix comprises a GCC transform matrix.

* * * * *